(12) United States Patent
Kawai et al.

(10) Patent No.: US 7,088,620 B2
(45) Date of Patent: Aug. 8, 2006

(54) NONVOLATILE SEMICONDUCTOR MEMORY DEVICE

(75) Inventors: Ken Kawai, Suita (JP); Takafumi Maruyama, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/080,424

(22) Filed: Mar. 16, 2005

(65) Prior Publication Data

US 2005/0232013 A1    Oct. 20, 2005

(30) Foreign Application Priority Data

Mar. 31, 2004   (JP) .............................. 2004-106210

(51) Int. Cl.
*G11C 16/04*    (2006.01)
(52) U.S. Cl. .............................. 365/185.18; 365/185.11; 365/189.09
(58) Field of Classification Search .................... None
See application file for complete search history.

(56) References Cited

U.S. PATENT DOCUMENTS

| | | | | |
|---|---|---|---|---|
| 5,038,327 A | * | 8/1991 | Akaogi .................. | 365/185.23 |
| 5,333,122 A | * | 7/1994 | Ninomiya .............. | 365/189.11 |
| 5,455,789 A | * | 10/1995 | Nakamura et al. ..... | 365/185.17 |
| 5,513,146 A | * | 4/1996 | Atsumi et al. ......... | 365/185.23 |
| 6,181,606 B1 | | 1/2001 | Choi et al. | |
| 6,483,750 B1 | * | 11/2002 | Dallabora et al. ..... | 365/185.23 |
| 6,535,425 B1 | * | 3/2003 | Nawaki et al. ........ | 365/185.18 |
| 6,587,375 B1 | | 7/2003 | Chung et al. | |
| 6,771,547 B1 | * | 8/2004 | Tanzawa et al. ....... | 365/189.09 |

FOREIGN PATENT DOCUMENTS

JP            5-290587        11/1993

* cited by examiner

*Primary Examiner*—Son Mai
(74) *Attorney, Agent, or Firm*—McDermott Will & Emery LLP

(57) ABSTRACT

A plurality of switches composing a voltage changing switch circuit 17 are supplied with a plurality of types of voltages, and are provided so as to correspond to a plurality of row decoders 2, such that each switch can separately select and output any of the plurality of types of voltages to the corresponding row decoder 2. Voltage boost circuits 7, 8 generate a plurality of types of voltages by boosting a power supply voltage. A regulator circuit 9 steps down at least one of the plurality of types of voltages generated by the voltage boost circuits 7, 8 to stabilize a voltage value, and outputs the resultant voltage to each switch. Each row decoder 2 selects a memory cell by using a voltage outputted from the corresponding switch. Thus, it is possible to reduce a time required for a program/program verify operation, while reducing power consumption.

11 Claims, 22 Drawing Sheets

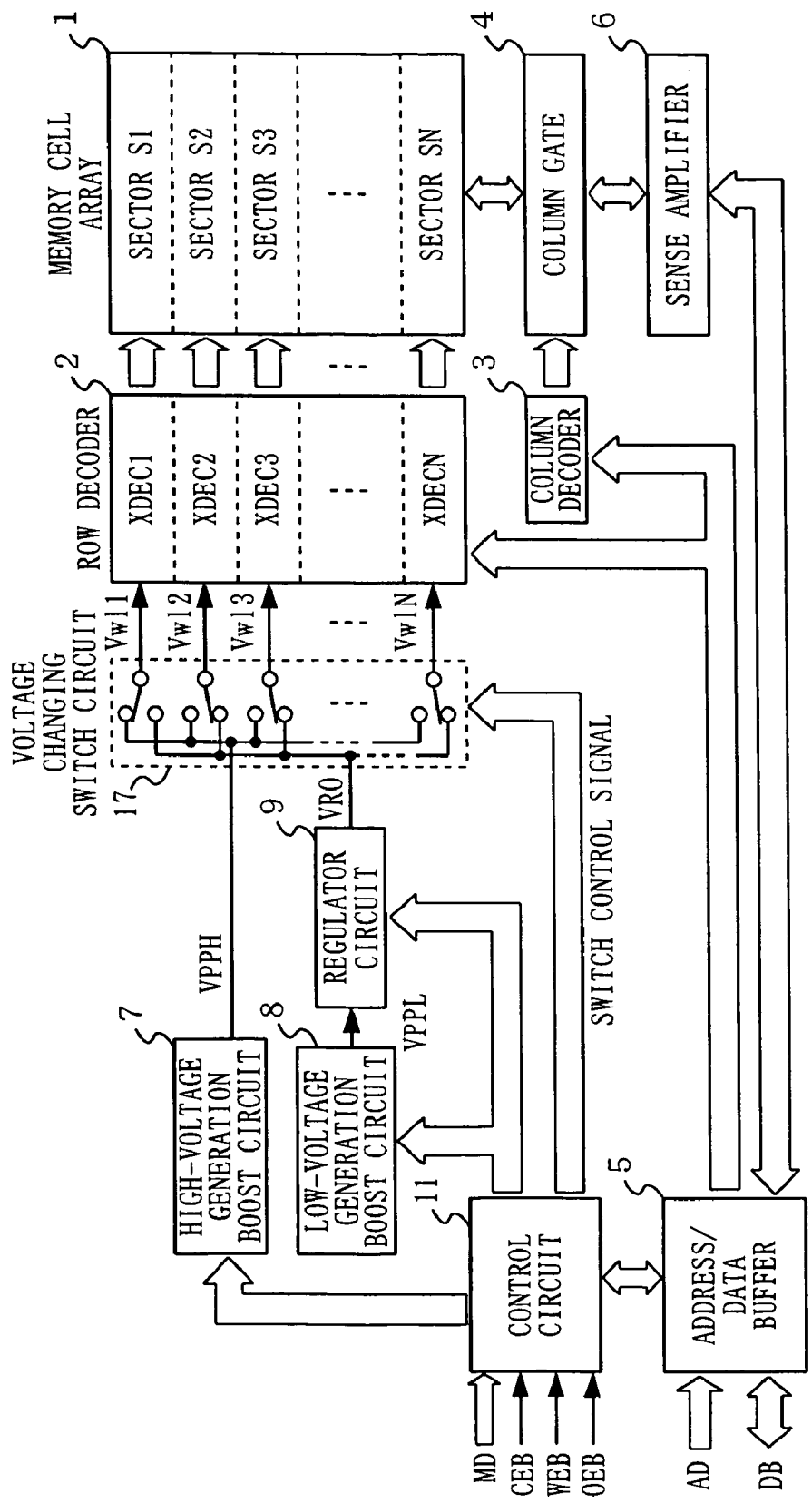
F I G. 1

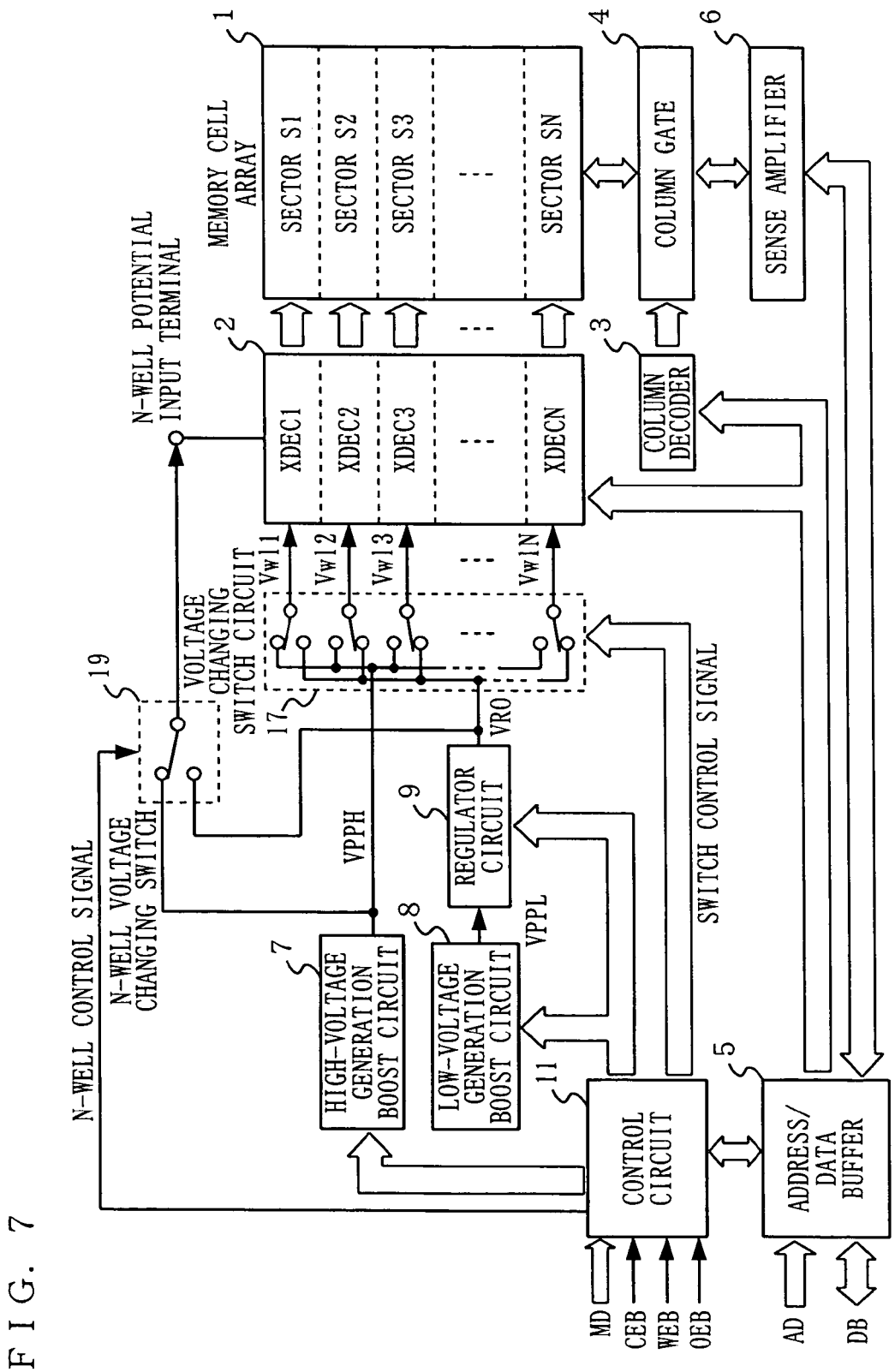
F I G. 7

NONVOLATILE SEMICONDUCTOR MEMORY DEVICE

BACKGROUND OF THE INVENTION

1. Field of the Invention

The present invention relates to nonvolatile semiconductor memory devices, more particularly, relates to a nonvolatile semiconductor memory device having a memory cell array in which a plurality of memory cells are disposed in the form of a matrix and are divided into a plurality of sectors.

2. Description of the Background Art

A conventional nonvolatile semiconductor memory device such as a flash EEPROM realizes program/erase and read operations using various high voltages. In order to generate these high voltages, a voltage boost circuit for boosting a power supply voltage and outputting a high voltage is generally used. Thus, a nonvolatile semiconductor memory device having a built-in voltage boost circuit is widely used (for example, see Japanese Laid-Open Patent Publication No. 5-290587, pages 4–5, FIG. 1).

Hereinafter, a conventional nonvolatile semiconductor memory device as shown in FIG. 16 will be described. FIG. 16 is a block diagram showing a structure of a conventional EEPROM. A memory cell array 1 is divided into N (N is natural number) sectors S1 to SN. The sectors S1 to SN are electrically rewritable nonvolatile memory cells, and floating gate memory cells MC are arranged and connected in a NOR array configuration as shown in FIG. 17. The drain of each memory cell MC is connected to a bit line BL, the source thereof is connected to a common source line SL, and a control gate thereof is connected to a word line WL. The word line WL of each of the sectors S1 to SN is selected by a row decoder 2 that is divided into N (N is natural number) decoder blocks XDEC1 to XDECN, and the bit line BL is selected by a column gate 4 that is driven by a column decoder 3. An address AD is inputted to an address/data buffer 5, and a row address and a column address are decoded by the row decoder 2 and the column decoder 3, respectively.

When data is read, bit line data selected by the column gate 4 is detected and amplified by a sense amplifier 6, and outputted from an I/O terminal via the address/data buffer 5. Also, when data is written, data DB inputted from the I/O terminal is latched by the sense amplifier 6 via the address/data buffer 5, and the latched data DB is transferred to the bit line BL selected by the column gate 4.

The high-voltage generation boost circuit 7 and the low-voltage generation boost circuit 8 are provided for generating a boost voltage higher than a power supply voltage that is necessary to program/erase/read data. A low boost output voltage VPPL of the low-voltage generation boost circuit 8 is supplied to a regulator circuit 9. After the voltage is stabilized, the regulator circuit 9 outputs a regulator output voltage VRO. Also, a high boost output voltage VPPH of the high-voltage generation boost circuit 7 is supplied to a voltage changing switch circuit 10 along with the regulator output voltage VRO of the regulator circuit 9. In accordance with a switch control signal supplied from a control circuit 11, the voltage changing switch circuit 10 selects the high boost output voltage VPPH or the regulator output voltage VRO of the regulator circuit 9, and supplies the selected voltage to the row decoder 2 as word line supply voltages Vwl1 to VwlN. In accordance with to a mode signal MD, a chip enable signal CEB, a program enable signal WEB, and an output enable signal OEB, the control circuit 11 controls the address/data buffer 5, the high-voltage generation boost circuit 7, the low-voltage generation boost circuit 8, the regulator circuit 9, and the voltage changing switch circuit 10 so that each circuit performs a predetermined operation according to a data program/erase/read mode.

FIG. 18 shows one example of the high-voltage generation boost circuit 7. In FIG. 18, a two-phase clock voltage boost circuit driven by a boost clock is shown. In this two-phase clock voltage boost circuit, diode-connected NMOS transistors Mn1 to Mn6, and Mn10 are connected in series to form a seven-stage circuit. An input terminal of the first NMOS transistor Mn1 is fixed to a power supply potential Vcc (=2.5V), smoothing capacitance Co and a Zener diode Dzh are inserted between an output terminal, which supplies the high boost output voltage VPPH, and a ground potential Vss, and a switch circuit 12 that is electrically connected/disconnected in accordance with a stop mode signal is inserted between the output terminal and the power supply potential Vcc.

FIG. 19 shows one example of the low-voltage generation boost circuit 8. In FIG. 19, any component elements that have similar counterparts in FIG. 18 are denoted by the same reference numerals as those used therein. In FIG. 19, diode-connected NMOS transistors Mn1 to Mn4, and Mn10 are connected in series to form a five-stage circuit, and a Zener diode Dzl is inserted between an output terminal, which supplies the low boost output voltage VPPL, and the ground potential Vss.

As shown in FIG. 20, the regulator circuit 9 includes a comparator CMP, which uses the low boost output voltage VPPL as a power supply, and a PMOS transistor Mp1 that is controlled to turn ON/OFF by an output of the comparator CMP and is connected in series between a VPPL node and a VSS terminal. In this case, the drain terminal of the PMOS transistor Mp1 functions as an output terminal, and supplies the regulator output voltage VRO. A VRO output terminal is provided with a resistance voltage divider circuit, in which resistances R1 to R3 are connected in series, and a feedback voltage VFB of the resistance R3 is fed back to a noninverting input terminal of the comparator CMP. A reference voltage VREF is inputted to an inverting input terminal of the comparator CMP. Therefore, ON/OFF control of the PMOS transistor Mp1 is performed so that a feedback voltage VFB is equal to the reference voltage VREF. Also, a short-circuit PMOS transistor Mp2, which is controlled by a mode control signal RDB, is connected between a node NR, which exists between the resistances R1 and R2, and the VRO output terminal. For example, a potential is controlled so that a mode control signal RDB is deactivated and the PMOS transistor Mp2 is turned ON in a read operation, whereas the PMOS transistor Mp2 is turned OFF in a program verify operation. As a result, for example, it is possible to output a VRO of 4.5V in a read operation, and output a VRO of 5.5V in a program verify operation. Also, a switch circuit 13, which is controlled by a stop mode signal, is inserted between the VRO output terminal and a Vcc power supply terminal, and a switch circuit 14, which is controlled by a stop mode bar signal, is provided between a node N1 of the resistance R3 and a Vss ground terminal.

FIG. 21 shows one example of a unit decoder comprising the row decoder 2. The unit decoder consists of a NAND gate G1 carrying out the logical product (AND) between a plurality of row addresses ADR, a level shift circuit 15, and a driver circuit 16. In a unit decoder selected from among the N decoder blocks, a node N2 is deactivated. The level shift circuit 15 consists of PMOS transistors Mp3 and Mp4, NMOS transistors Mn11 and Mn12, and an inverter gate G2.

A signal of the node N2 is inputted to a gate of the NMOS transistor Mn11, and an inversion signal of the node N2 is inputted to a gate of the NMOS transistor Mn12. The driver circuit 16 is an inverter circuit consisting of an NMOS transistor Mn13 and a PMOS transistor Mp5. The driver circuit 16 uses an output of the level shift circuit 15 as an input, and uses a word line supply voltage Vwll as a power supply. An output voltage of the driver circuit 16 is applied to the control gate of the memory cell MC. Also, in this case, all N-well nodes NW of the PMOS transistors Mp3 to Mp5 are connected to the word line supply voltage Vwll.

Hereinafter, an operation of the above-described nonvolatile semiconductor memory device will be described. In a data program operation, the high boost output voltage VPPH (=10V) is applied, as a word line WL voltage, to the control gate of the memory cell MC that is selected in accordance with a program address AD and a data DB input, and 0V is applied to a non-selected word line WL. At this time, in accordance with the data DB to be written, 5V or 0V is applied to the bitline BL. Also, 0V is applied to the common source line SL. As a result, writing is performed on the memory cell MC that is connected to a selected word line WL and whose drain terminal is provided with 5V via the bit line BL, an electron is added to the floating gate, and a threshold value of the memory cell MC increases in a normal direction.

Specific operations of the power supply circuit and the decoder 2 are as follows: A boost clock is inputted to the high-voltage generation boost circuit 7 as shown in FIG. 18 from the control circuit 11. A boost voltage higher than a power supply voltage is generated by a known charge transfer operation, and clamped to 10V by the Zener diode Dzh provided on the output terminal, and the high boost output voltage VPPH (=10V) is supplied to the voltage changing switch circuit 10. At this time, a stop mode signal inputted from the control circuit 11 is deactivated, and the switch circuit 12 is electrically disconnected. Also, a boost clock is inputted to the low-voltage generation boost circuit 8 as shown in FIG. 19 in a similar manner. A boost voltage higher than a power supply voltage is generated and clamped to 7V by the Zener diode Dzl provided on the output terminal, and the low boost output voltage VPPL (=7V) is supplied to the regulator circuit 9. At this time, a stop mode signal is activated and a stop mode bar signal is deactivated since the regulator circuit 9 as shown in FIG. 20 stops during a program operation. As a result, the switch circuit 13 is electrically connected, whereas the switch circuit 14 is electrically disconnected, and the regulator output voltage VRO (=Vcc) is supplied to the voltage changing switch circuit 10.

In the voltage changing switch circuit 10, the high boost output voltage VPPH (=10V) is selected in accordance with a switch control signal supplied from the control circuit 11, and supplied to all the decoder blocks XDEC1 to XDECN of the row decoder 2 as word line supply voltages Vwll to VwlN. At this time, as shown in FIG. 21, a very large load capacitance such as the N-well node NW, which is used in common by all the decoder blocks XDEC1 to XDECN, is charged by the word line supply voltages Vwll to VwlN. After charge is completed, a predetermined word line WL is selected, and only a node N2 of a unit decoder driving the selected word line WL is deactivated. Thus, the high boost output voltage VPPH (=10V) is outputted and applied to the control gate of the selected memory cell MC. Voltages of non-selected word lines WL are not changed (=0V).

Next, in a program verify operation, 1V is applied to the selected bit line BL at the same time as the regulator output voltage VRO (=5.5V) is applied to a control gate of a cell for which writing is performed. Also, 0V is applied to the common source line. At this time, a bit line potential is detected and amplified by the sense amplifier 6 to determine whether the above cell is a cell for which writing has been performed or a cell for which erasure has been performed. When it is determined that the above cell is a cell for which writing has been performed, a next program operation is cancelled. On the other hand, when it is determined that the above cell is a cell for which erasure has been performed, a next program operation is performed. Specific circuit operations of the power supply circuit and the row decoder 2 are as follows: a stop mode signal is activated at the same time as a boost clock to be supplied to the high-voltage generation boost circuit 7 as shown in FIG. 18 is stopped, and the switch circuit 12 is electrically connected. As a result, a power supply potential Vcc is supplied to the voltage changing switch circuit 10.

As is the case with the program operation, a boost clock is inputted to the low-voltage generation boost circuit 8 as shown in FIG. 19. A boost voltage higher than a power supply voltage is generated and clamped to 7V by the Zener diode Dzl provided on the output terminal, and the low boost output voltage VPPL (=7V) is supplied to the regulator circuit 9. At this time, in the regulator circuit 9 as shown in FIG. 20, a mode control signal RDB is activated, the PMOS transistor Mp2 is OFF, and the resistance R1 is enabled. At the same time, a stop mode signal is deactivated and as top mode bar signal is activated, whereby the switch circuits 13 and 14 are electrically disconnected and connected, respectively. As a result, the regulator output voltage VRO (=5.5V) is supplied to the voltage changing switch circuit 10.

Next, in the voltage changing switch circuit 10, the regulator output voltage VRO (=5.5V) is selected in accordance with a switch control signal supplied from the control circuit 11, and supplied to all the decoder blocks XDEC1 to XDECN of the row decoder 2 as word line supply voltages Vwll to VwlN. At this time, as shown in FIG. 21, a load capacitance such as the N-well node NW, which is used in common by all the decoder blocks XDEC1 to XDECN, is charged by the word line supply voltages Vwll to VwlN. After charge is completed, a predetermined word line WL is selected, and the regulator output voltage VRO (=5.5V) is outputted and applied to a control gate of the selected memory cell MC. Voltages of non-selected word lines WL are not changed (=0V).

FIG. 22 shows a timing chart indicating a voltage system supplied to a word line WL during the above-described program/program verify operation. First, in a stop state (STOP), word line supply voltages Vwll to VwlN coincide with a power supply potential Vcc due to a stopped state of the high-voltage generation boost circuit 7, the low-voltage generation boost circuit 8, and the regulator circuit 9. Next, when a transition is made to a program state (Program), the high-voltage generation boost circuit 7 and the low-voltage generation boost circuit 8 enter an operation state. In this state, the high-voltage generation boost circuit 7 charges a load capacitance from the power supply potential Vcc up to a high boost output voltage VPPH (=10V), and the low-voltage generation boost circuit 8 charges a load capacitance from the power supply potential Vcc up to a low boost output voltage VPPL (=7V). At this time, the voltage changing switch circuit 10 causes the high boost output voltage VPPH (=10V) to pass through the row decoder 2, whereby a load capacitance seen by the high-voltage generation boost circuit 7 becomes very large. As a result, it is necessary to take a very long setup time t1.

Next, when a transition is made from a program state to a program verify state (PV), the high-voltage generation boost circuit 7 enters a stopped state, and the high boost output voltage VPPH (=10V) is discharged to a power supply potential Vcc. Also, the regulator circuit 9 is in an operation state, and the regulator output voltage VRO (=5.5V) obtained by stepping down the low boost output voltage VPPL (=7V) is supplied to the row decoder 2 via the voltage changing switch circuit 10. In the case where it is not determined that writing is completed in the above PV operation, a transition is made to next Program and PV operations. Note that a load capacitance is charged from the regulator output voltage VRO (=5.5V). Thus, a setup time $\tau 1$ to reach the high boost output voltage VPPH (=10V) in a second or later program mode is slightly shorter than the first setup time $\tau 11$. Hereinafter, the above-described program/program verify operation is repeated until writing is performed for all desired memory cells MC.

As described above, in a method in which a program/program verify operation is repeated, if necessary, a plurality of times, a very large load capacitance such as the N-well node NW of the row decoder 2 has to be charged by the high boost output voltage VPPH (=10V) every time a transition is made to a program mode. As a result, it is necessary to take a very long setup time $\tau 1$ every time a loop is executed. Thus, the conventional nonvolatile semiconductor memory device has disadvantages in that power consumption of the high-voltage generation boost circuit 7 which supplies a high boost charge is increased due to a very long time required for a program/program verify operation and a very large load capacitance to be charged and discharged by a high boost charge. Also, another disadvantage is that power consumption is increased if current supply capacity of the high-voltage generation boost circuit 7 generating VPPH is enhanced in order to reduce $\tau 1$.

As such, the above-described structure has disadvantages in that it is difficult to reduce a time required for a program/program verify operation and power consumption, and that power consumption is increased by reducing a time required for a program/program verify operation.

SUMMARY OF THE INVENTION

Therefore, an object of the present invention is to provide a high-performance nonvolatile semiconductor memory device capable of reducing a time required for a program/program verify operation, while reducing power consumption.

In a nonvolatile semiconductor memory device according to the present invention, in a memory cell array, a plurality of memory cells are disposed in the form of a matrix and are divided into a plurality of sectors. A plurality of row decoder circuits are provided so as to correspond to the sectors of the memory cell array. Each row decoder circuit selects a memory cell included in the corresponding sector based on an externally inputted address signal. A plurality of switches are supplied with a plurality of types of voltages. The plurality of switches are provided so as to correspond to the plurality of row decoder circuits, such that each switch can separately select and output any of the plurality of types of voltages to the corresponding row decoder circuit. A voltage boost circuit generates the plurality of types of voltages by boosting a power supply voltage. A regulator circuit steps down at least one of the plurality of types of voltages generated by the voltage boost circuit to stabilize a voltage value, and outputs the resultant voltage to each switch. The row decoder circuit selects the memory cell by using a voltage outputted from the corresponding switch.

As described above, by including the switch, in the case where a transition is made to a program mode, it is possible to charge a high voltage only to a load capacitance such as an N-well in a predetermined decoder block. As a result, a load capacitance is considerably reduced, and the amount of electric charge for charging/discharging a load capacitance at high voltage as well as power consumption are reduced. Also, a setup time to reach a high voltage is reduced. Thus, it is possible to reduce a time required for a program/program verify operation. Also, by including the voltage boost circuit, the nonvolatile semiconductor memory device is able to operate with a single power supply without being externally supplied with a plurality of power supplies. Thus, versatility of the nonvolatile semiconductor memory device is increased. Additionally, an operation with a single power supply is enabled by using the voltage boost circuit, whereby it is possible to further reduce a setup time to reach a high voltage, and further reduce the amount of electric charge for charging/discharging a load capacitance at high voltage, which has a considerable impact on consumption power. Thus, it is possible to increase the effectiveness in reducing consumption power. As a result, a time required for a program/program verify operation can be reduced more effectively. Also, by including a regulator circuit, a voltage outputted from a switch is stabilized. As a result, it is possible to control a memory cell gate voltage with high precision, whereby program and read disturb characteristics are improved.

Also, the control circuit generates a switch control signal used for selecting each switch based on the address signal, and each switch selects a voltage to be outputted to the corresponding row decoder circuit based on the switch control signal. As such, the switch is controlled by the control circuit.

Also, the plurality of types of voltages at least include a first voltage and a second voltage which is lower than the first voltage. When data is written to a memory cell, the control circuit generates a switch control signal based on the address signal for causing one of the row decoder circuits, which is used for selecting the memory cell, to output the first voltage, and causing the other row decoder circuits to output the second voltage.

As described above, by including the switch, in the case where a transition is made to a program mode, it is possible to charge a high voltage only to a load capacitance such as an N-well in a predetermined decoder block. As a result, a load capacitance is considerably reduced, and the amount of electric charge for charging/discharging a load capacitance at high voltage as well as power consumption are reduced. Also, a setup time to reach a high voltage is reduced. Thus, it is possible to reduce a time required for a program/program verify operation.

Also, each row decoder circuit includes a plurality of PMOS transistors formed in an N-well. An N-well input terminal is a terminal for applying any of the plurality of types of voltages generated by the voltage boost circuit to the N-well, and a boost control circuit controls the voltage boost circuit so that a voltage is applied to the N-well input terminal before data is written to a memory cell.

As described above, by always applying a maximum voltage used in the nonvolatile semiconductor memory device to the N-well potential input terminal during a program/program verify operation, it is possible to further reduce a memory cell gate supply voltage setup time, and further reduce charge/discharge current of a load capacitance such as a redundant N-well capacitance. Thus, a high-performance and low-power consumption nonvolatile semiconductor memory device can be realized.

Also, before data is written, a third voltage, which is the highest of the plurality of types of voltages, is applied to the N-well input terminal. As such, by using the voltage boost circuit generating an existing maximum voltage, an external high-voltage application terminal and an external applied-voltage control terminal become unnecessary. Thus, it is possible to reduce the area.

Also, an N-well voltage changing switch selects a voltage to be outputted to the N-well input terminal. A switch control circuit switches between the third voltage and a fourth voltage which is lower than the third voltage, and causes the N-well voltage changing switch to output either the third or fourth voltage.

Thus, when a read operation is performed, the fourth voltage which is lower than the third voltage is applied to an N-well of the PMOS transistor. By simple control utilizing the above-described existing voltage boost circuit, it is possible to suppress an increase of a threshold value voltage, which is caused by the back bias effect of the PMOS transistor comprising the row decoder section, during a normal read operation. As a result, current drive capacity is improved, and high-speed readout is realized. Also, it is possible to stop the voltage boost circuit, which supplies the maximum voltage, during a read operation, whereby power consumption at the time of readout can be considerably reduced.

Also, before data is written, the switch control circuit controls the N-well voltage changing switch so as to apply the third voltage to the N-well input terminal. When data is read, the switch control circuit controls the N-well voltage changing switch so as to apply the fourth voltage to the N-well input terminal. As such, by including a voltage drop circuit and a comparison circuit, which function as a discharge circuit, a reduction speed of a high boost charge is enhanced. Thus, it is possible to reduce a read setup time.

Also, the voltage drop circuit may drop a voltage of the N-well input terminal when the switch control circuit controls the N-well voltage changing switch so as to apply the fourth voltage. The comparison circuit may compare the voltage of the N-well input terminal dropped by the voltage drop circuit with the fourth voltage. When the comparison circuit determines that the voltage of the N-well input terminal dropped by the voltage drop circuit and the fourth voltage have become equal, the switch control circuit may control the N-well voltage changing switch so as to apply the fourth voltage to the N-well input terminal.

Also, the row decoder may include a plurality of PMOS transistors formed in an N-well, and a plurality of NMOS transistors formed in a P-well formed in the N-well. Furthermore, a negative voltage input terminal may be a terminal for applying either at least one negative voltage included in the plurality of voltages generated by the voltage boost circuit or a ground voltage to a control gate of the memory cell via the row decoder circuit. A boost control circuit may control the voltage boost circuit so as to apply a negative voltage to the negative voltage input terminal when the amount of electron is reduced in a charge storage area provided on the memory cell. Still further, the at least one type of voltage may be a voltage to be used when data is read. As such, by structuring the transistor included in the row decoder so as to have a so-called triple-well structure, it is possible to apply a negative voltage to a WL line when erasure is performed. Thus, it is possible to improve the reliability such as disturb characteristics and endurance characteristics of the memory cell MC.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing a structure of a nonvolatile semiconductor memory device in a first embodiment of the present invention;

FIG. 7 is a block diagram showing a structure of a nonvolatile semiconductor memory device in the third embodiment of the present invention;

DESCRIPTION OF THE PREFERRED EMBODIMENTS

Hereinafter, with reference to the drawings, embodiments of the present invention will be described.

Figure 16:
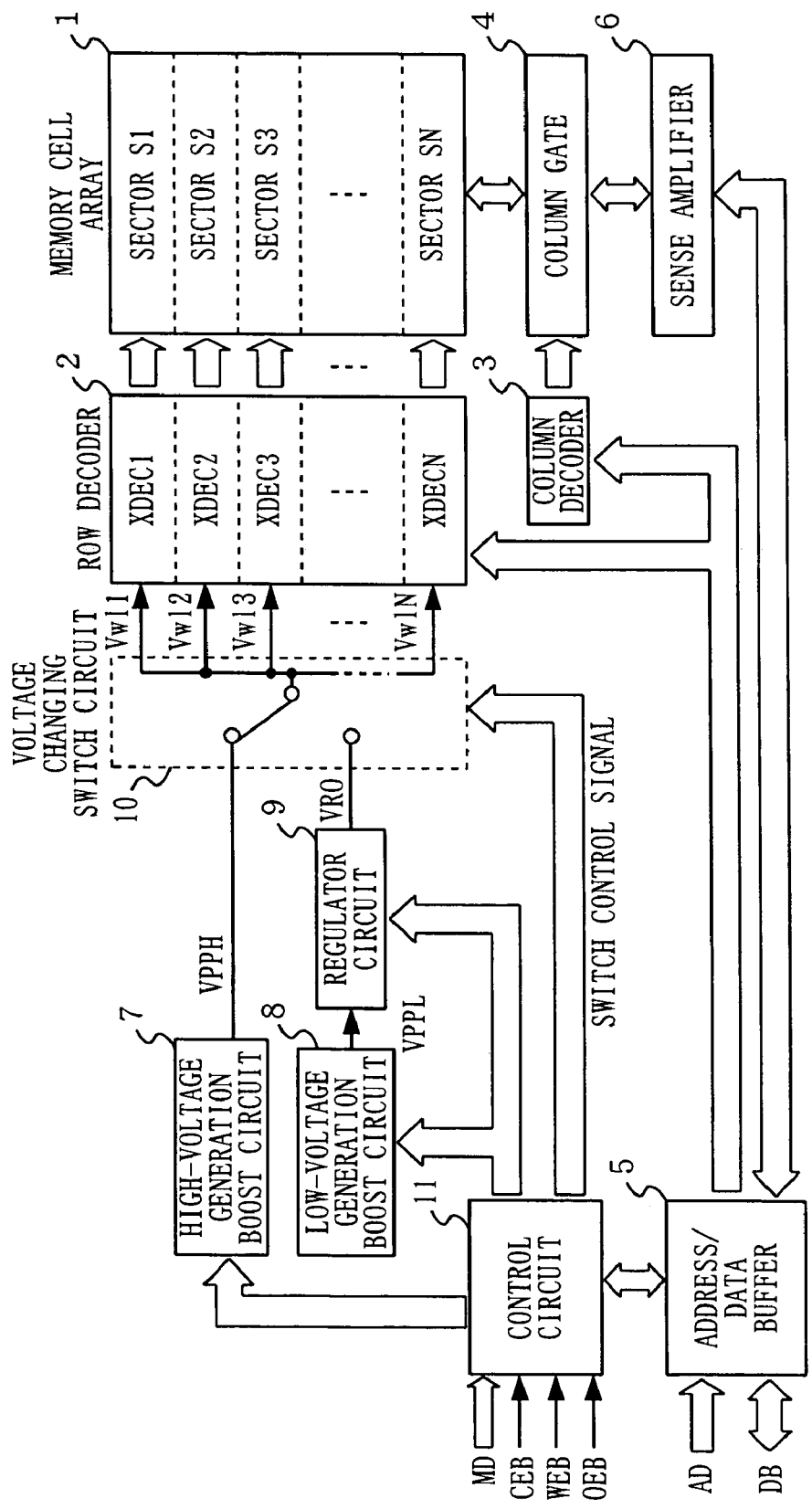
FIG. 16 is a block diagram showing a structure of a conventional nonvolatile semiconductor memory device.
Figure 17:
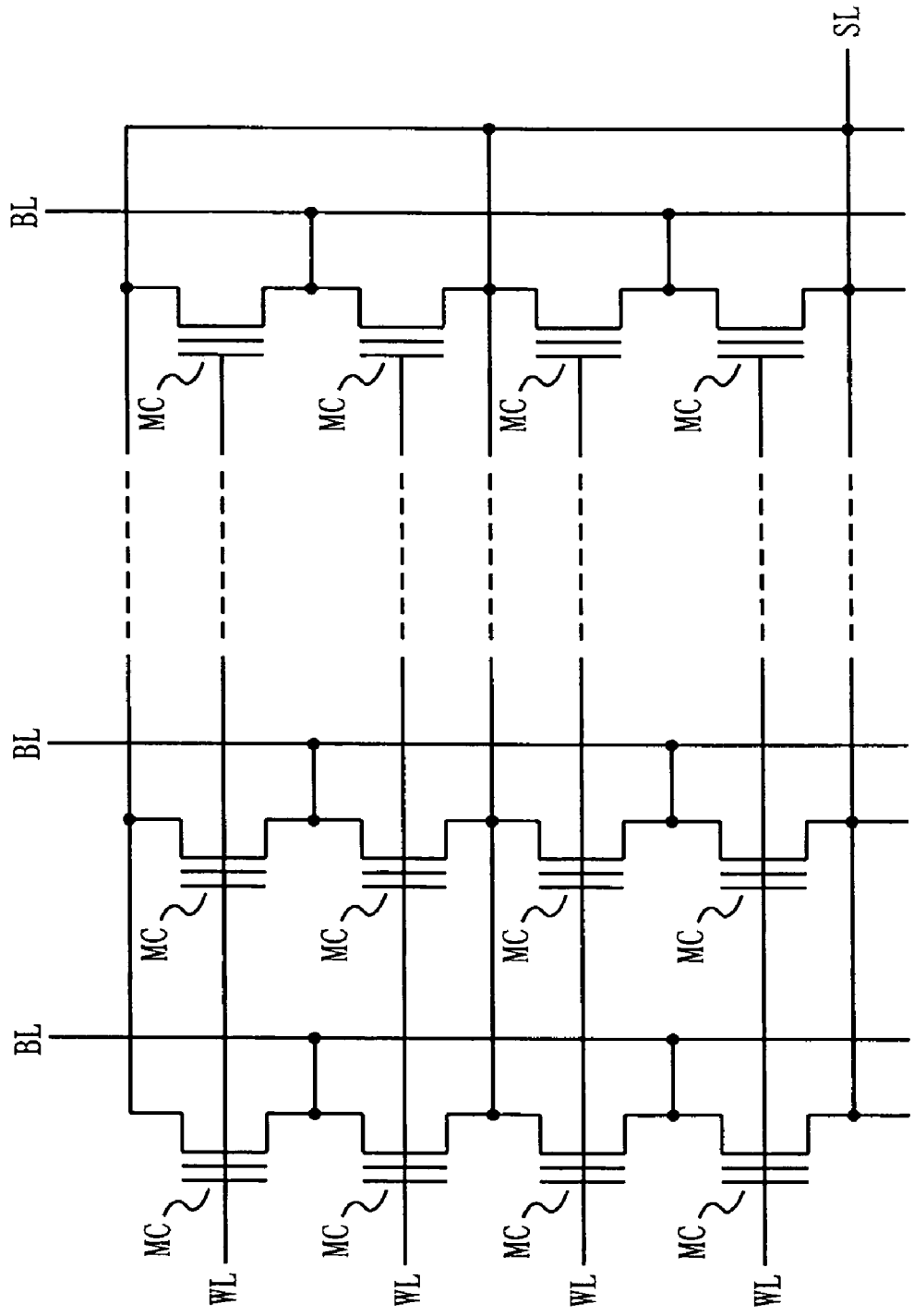
FIG. 17 is an equivalent circuit diagram showing a floating gate memory cell array.
Figure 18:
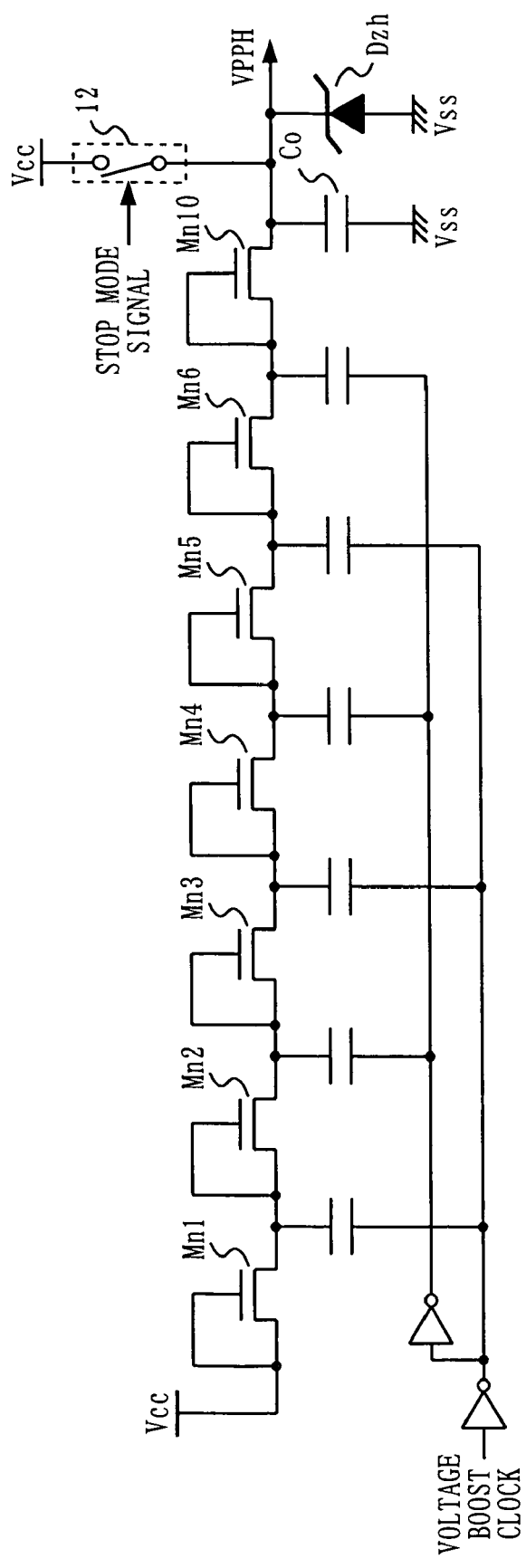
FIG. 18 is a circuit diagram showing a structure of a high-voltage generation boost circuit.
Figure 19:
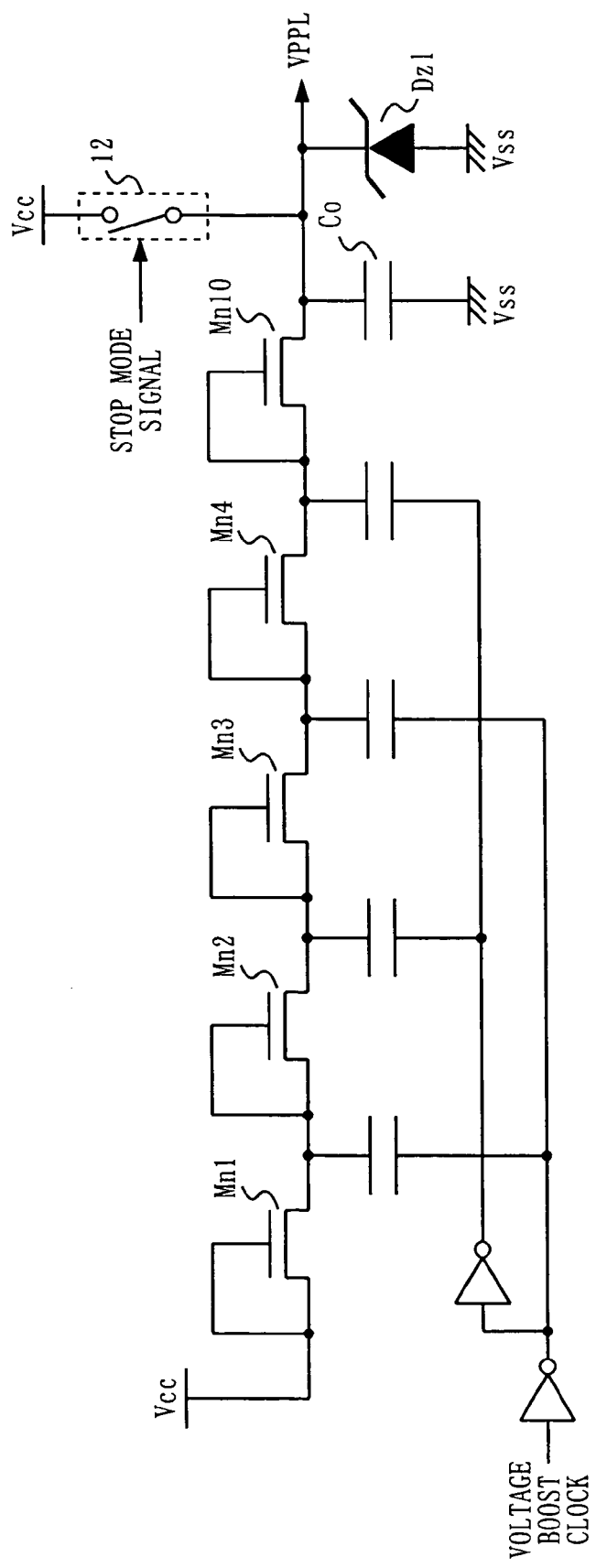
FIG. 19 is a circuit diagram showing a structure of a low-voltage generation boost circuit.

FIG. 1 is a block diagram showing a structure of a nonvolatile semiconductor memory device in a first embodiment of the present invention. In FIG. 1, any component elements that have similar counterparts in FIG. 16 will be denoted by the same reference numerals as those used therein, and the detailed description thereof is omitted.

The first embodiment is characterized by including a voltage changing switch circuit 17 comprising N (N is natural number) unit switches using two types of voltages: a high boost output voltage VPPH (=10V) and a regulator output voltage VRO (=5.5V) as an input, and selecting and outputting one of the two types of voltages in accordance with a switch control signal. In a stop state (STOP) or a program verify operation (PV), all unit switches of the voltage changing switch circuit 17 select the regulator output voltage VRO in accordance with a switch control signal. In a program operation (Program), only a desired one unit switch selects the high boost output voltage VPPH, whereas the other unit switches select the regulator output voltage VRO. At this time, word line supply voltages Vwl1 to VwlN, which are output voltages of the voltage changing switch circuit 17, are supplied to decoder blocks XDEC1 to XDECN, respectively.

Figure 2:
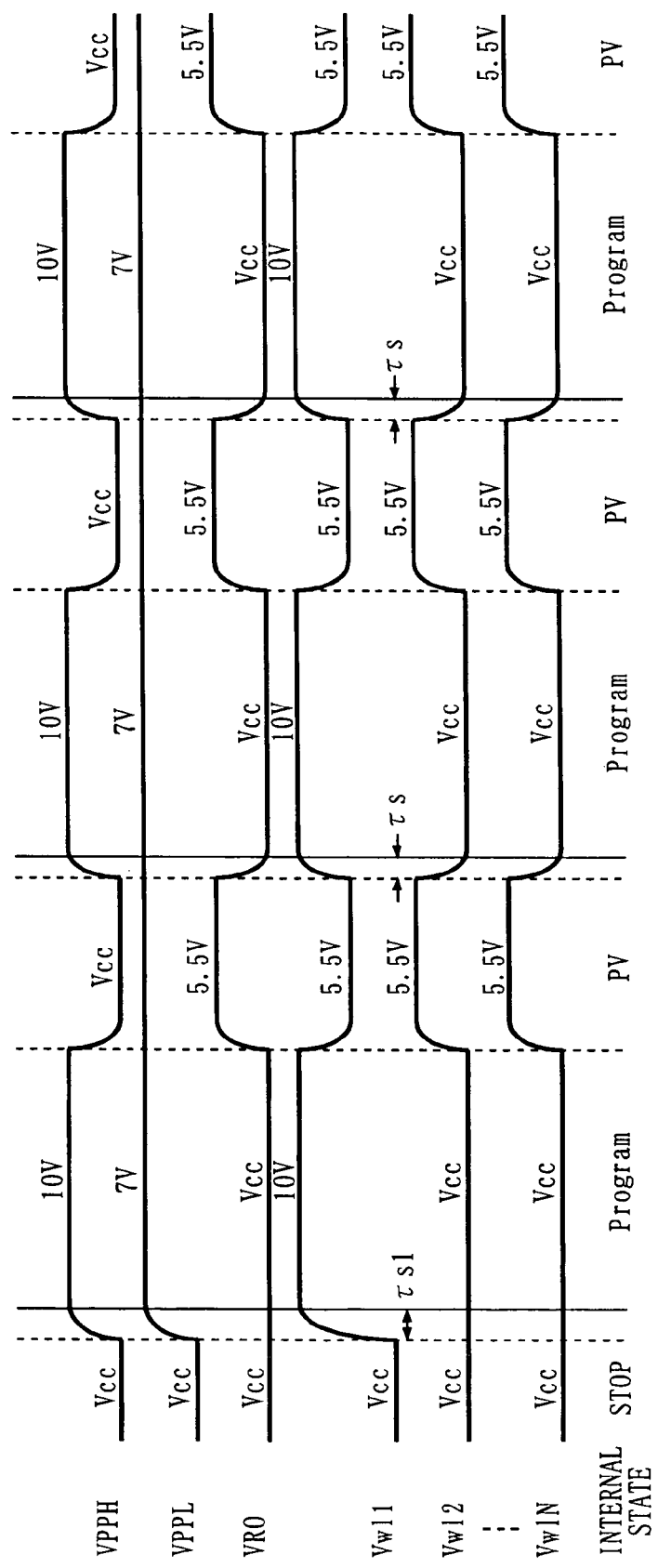
FIG. 2 is a timing chart showing a program operation and a program verify operation in the first embodiment of the present invention.

Hereinafter, an operation of the above-described nonvolatile semiconductor memory device of the present embodiment will be described. FIG. 2 shows a timing chart indicating a voltage system supplied to a word line WL during a program/program verify operation. First, in a stop state (STOP), the high-voltage generation boost circuit 7, the low-voltage generation boost circuit 8, and the regulator circuit 9 enter a stopped state, and a switch control signal causes all unit switches of the voltage changing switch circuit 17 to select the regulator output voltage VRO. Thus, the word line supply voltages Vwl1 to VwlN coincide with a power supply potential Vcc. Next, when a transition is made to a program state (Program), the high-voltage generation boost circuit 7 and the low-voltage generation boost circuit 8 enter an operation state, the high-voltage generation boost circuit 7 charges a load capacitance from the power supply potential Vcc up to a high boost output voltage VPPH (=10V), and the low-voltage generation boost circuit 8 charges a load capacitance from the power supply potential Vcc up to a low boost output voltage VPPL (=7V). At this time, in the voltage changing switch circuit 17, only one desired unit switch selects the high boost output voltage VPPH, whereby a load capacitance seen by the high-voltage generation boost circuit 7 becomes very small (approximately 1/N compared to the conventional device). Thus, a setup time $\tau$ s1 ($<\tau$ l1) required for charging a load capacitance of the decoder block XDEC1 is considerably reduced.

When a transition is made from a program state to a program verify state (PV), the high-voltage generation boost circuit 7 enters a stopped state, and the high boost output voltage VPPH (=10V) is discharged to a power supply potential Vcc. Also, the regulator circuit 9 is in an operation state, and a switch control signal causes all unit switches of the voltage changing switch circuit 17 to select the regulator output voltage VRO. Thus, the regulator output voltage VRO (=5.5V) obtained by stepping down the low boost output voltage VPPL (=7V) is supplied to all decoder blocks XDEC1 to XDECN. In the case where it is not determined that writing is completed in the above PV operation, a transition is made to a next Program and PV operations. Note that a load capacitance is charged from the regulator output voltage VRO (=5.5V). Thus, a setup time $\tau$ s ($<\tau$ 1) to reach the high boost output voltage VPPH (=10V) in a second or later program mode is slightly shorter than the first setup time $\tau$ s1 ($\tau$ s$<\tau$ s1). Hereinafter, the above-described program/program verify operation is repeated until writing is performed for all desired memory cells MC.

As described above, according to the first embodiment, by including the voltage changing switch circuit 17, it is possible to charge only a load capacitance such as an N-well in a predetermined decoder block by a high voltage, whereby a load capacitance is considerably reduced. As a result, the amount of electric charge for charging/discharging a load capacitance at high voltage is reduced, and power consumption is reduced. In addition, a setup time to reach a high voltage is reduced. Thus, it is possible to reduce a time required for a program/program verify operation, and realize a high-performance nonvolatile semiconductor memory device. Also, a voltage boost circuit enables an operation with a single power supply, whereby greater versatility is achieved. Furthermore, a regulator circuit enables high-precision control of a memory cell gate voltage, whereby it is possible to improve read-disturb characteristics and reliability of a memory cell.

Note that an N-well comprising each of the decoder blocks XDEC1 to XDECN of the present embodiment is isolated from each other, and the number of N-wells in each of the decoder blocks XDEC1 to XDECN may be one, or the N-well may be divided into a plurality of N-wells. However, the smaller the number of divided N-wells in each of the decoder blocks XDEC1 to XDECN is, the wider decoder block area can be reduced.

Note that, in the present embodiment, it is assumed that the number of sectors S1 to SN (N sectors) comprising a memory array 1 coincides with the number of decoder blocks XDEC1 to XDECN (N decoder blocks). However, it is not limited thereto. Also, it is assumed that the number of unit switches (N unit switches) coincides with the number of decoder blocks XDEC1 to XDECN (N decoder blocks), but it is not limited thereto.

Figure 3:
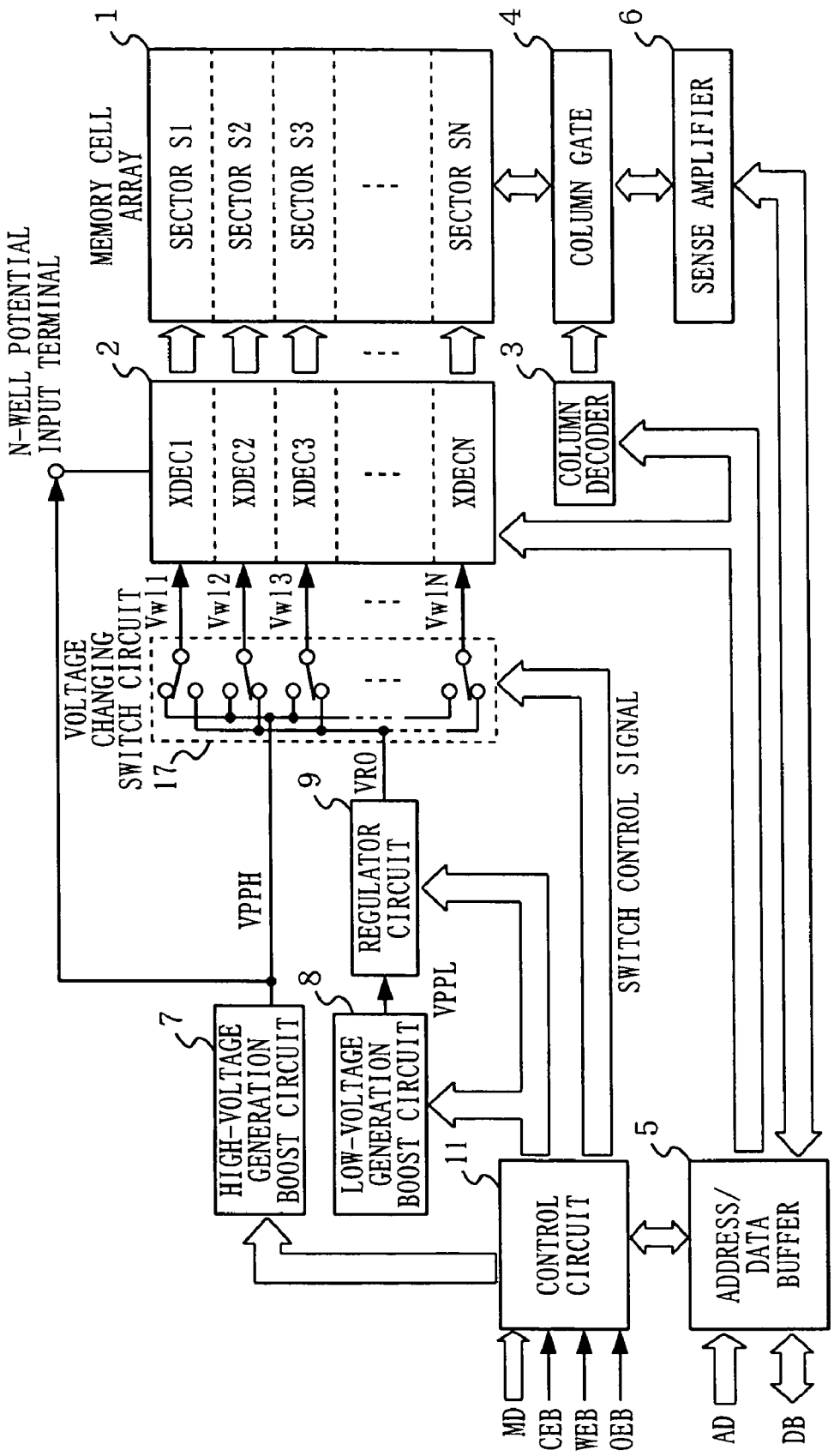
FIG. 3 is a block diagram showing a structure of a nonvolatile semiconductor memory device in a second embodiment of the present invention.

FIG. 3 is a block diagram showing a structure of a nonvolatile semiconductor memory device in a second embodiment of the present invention. In FIG. 3, any component elements that have similar counter parts in the first embodiment as shown in FIG. 1 will be denoted by the same reference numerals as those used therein, and the detailed description thereof is omitted.

The second embodiment is characterized in that a single N-well potential input terminal is provided so that a voltage of an N-well comprising a PMOS transistor included in the row decoder 2 can be controlled separately from a gate voltage applied to a memory cell, and is connected to an output terminal of the high-voltage generation boost circuit 7.

Figure 4:
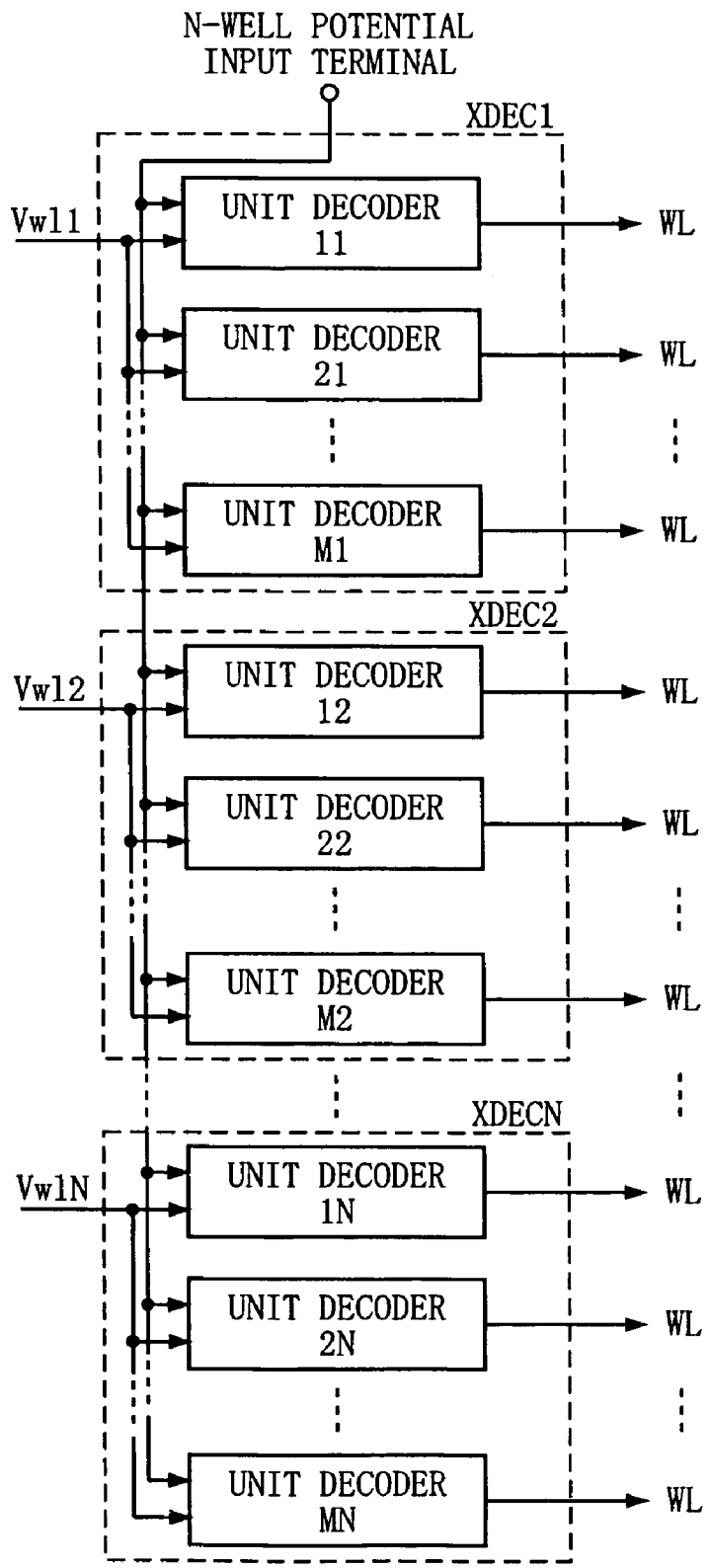
FIG. 4 is a block diagram showing an exemplary structure of a row decoder in second, third, and fourth embodiments of the present invention.
Figure 5:
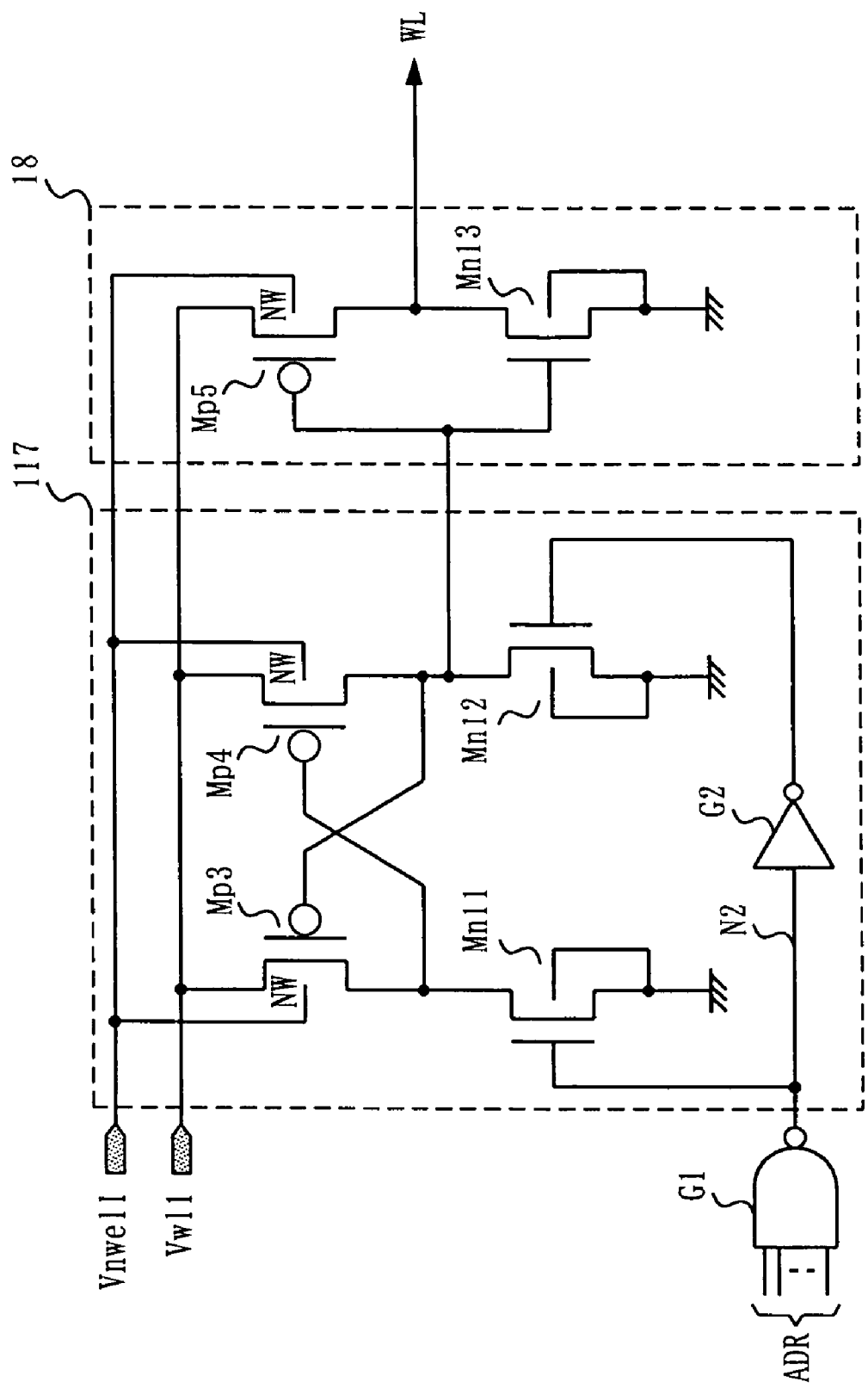
FIG. 5 is a circuit diagram showing a structure of a unit decoder in the second, third, and fourth embodiments of the present invention.

As shown in FIG. 3, the row decoder 2 has the N-well potential input terminal, and the N-well potential input terminal is connected to an output of the high-voltage generation boost circuit 7. The row decoder 2 comprises N (N is natural number) decoder blocks XDEC1 to XDECN as shown in FIG. 4, each of the decoder blocks XDEC1 to XDECN comprises M (M is natural number) unit decoders U1X to UMX (X=1, 2, ..., N), and the high boost output voltage VPPH is inputted to each of the unit decoders U1X to UMX (X=1, 2, . . . , N) via the N-well potential input terminal. As shown in FIG. 5, each of the unit decoders U1X to UMX (X=1, 2, . . . , N) comprises a level shift circuit 117 and a driver circuit 18, such that a voltage Vnwell of the N-well node NW can be controlled separately from a word line supply voltage Vwll.

Figure 6:
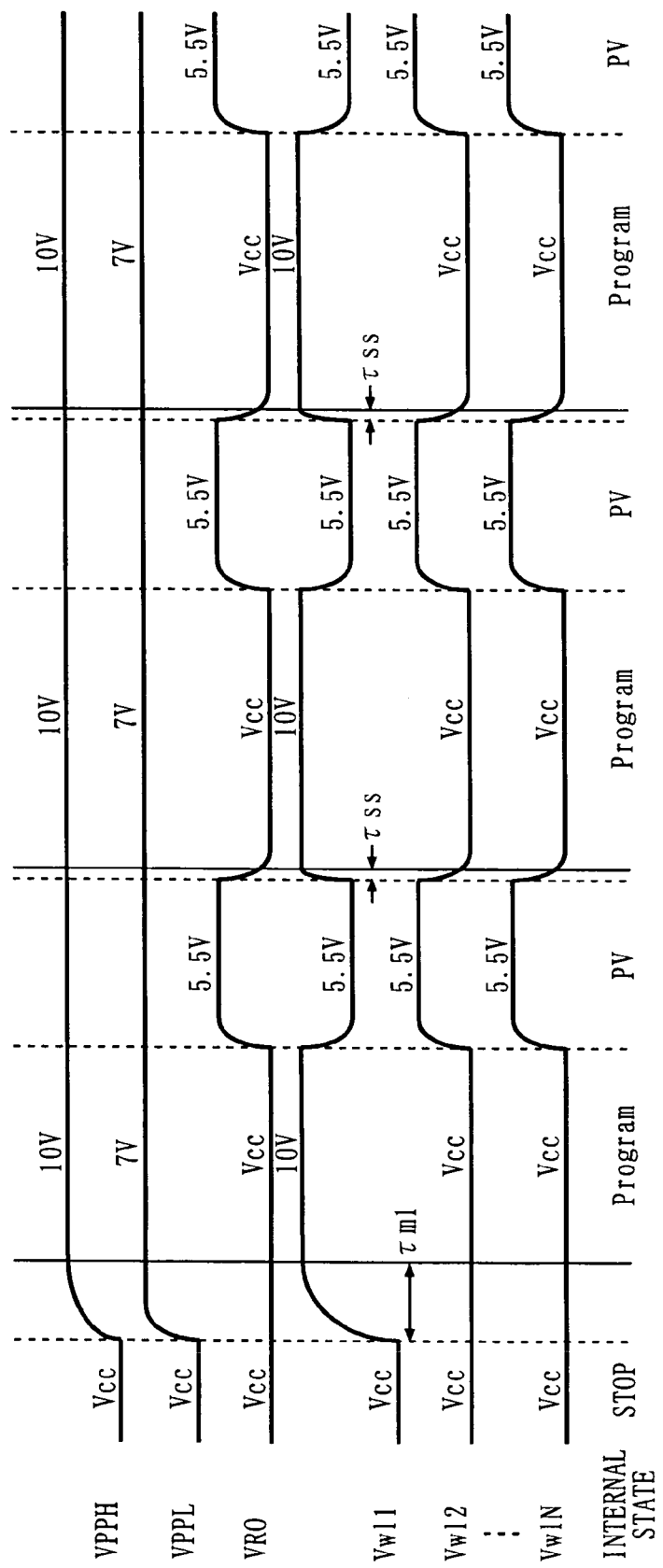
FIG. 6 is a timing chart showing a program operation and a program verify operation in the second embodiment of the present invention.

Hereinafter, an operation of the above-described nonvolatile semiconductor memory device of the present embodiment will be described. FIG. 6 shows a timing chart indicating a voltage system supplied to a word line WL during a program/program verify operation. First, in a stop state (STOP), the high-voltage generation boost circuit 7, the low-voltage generation boost circuit 8, and the regulator circuit 9 enter a stopped state, and a switch control signal causes all unit switches of the voltage changing switch circuit 17 to select the regulator output voltage VRO. Thus, the word line supply voltages Vwll to VwlN coincide with a power supply potential Vcc. Next, when a transition is made to a program state (Program), the high-voltage generation boost circuit 7 and the low-voltage generation boost circuit 8 enter an operation state. In this state, the high-voltage generation boost circuit 7 charges a load capacitance from the power supply potential Vcc up to a high boost output voltage VPPH (=10V), and the low-voltage generation boost circuit 8 charges a load capacitance from the power supply potential Vcc up to a low boost output voltage VPPL (=7V). At the same time, a very large N-well load capacitance of the row decoder 2 is charged by the high boost output voltage VPPH via the N-well potential input terminal, and a load capacitance of a desired decoder block XDEC1 selected by the voltage changing switch circuit 17 is also charged. At this time, a setup time to charge a load capacitance of the N-well and a load capacitance of the decoder block XDEC1 is τ m1 (τ s1<τ m1<τ l1) .

When a transition is made from a program state to a program verify state (PV), the regulator circuit 9 is in an operation state, and a switch control signal causes all unit switches of the voltage changing switch circuit 17 to select the regulator output voltage VRO. Thus, the regulator output voltage VRO (=5.5V) obtained by stepping down the low boost output voltage VPPL (=7V) is supplied to all decoder blocks XDEC1 to XDECN. In the case where it is not determined that writing is completed in the above PV operation, a transition is made to a next Program and PV operations. However, a setup time τ ss (<τ s<τ l) to reach the high boost output voltage VPPH (=10V) in a second or later program mode is dramatically reduced because the N-well load capacitance of the row decoder 2 has already been charged to VPPH (=10V), whereby only a load capacitance of the desired decoder block XDEC1 should be charged. Hereinafter, the above-described program/program verify operation is repeated until writing is performed for all desired memory cells MC.

As described above, according to the second embodiment, an N-well potential input terminal is provided so that a voltage of an N-well comprising a PMOS transistor included in the row decoder 2 can be controlled separately from a gate voltage applied to a memory cell, and the -well potential input terminal is connected to the output terminal of the high-voltage generation boost circuit 7. Thus, a maximum voltage used in the nonvolatile semiconductor memory device can be always applied to the N-well potential input terminal during a program/program verify operation, thereby eliminating the need of charging and discharging the N-well load capacitance of the row decoder 2 during a program/program verify cycle. As a result, it is possible to further reduce a memory cell gate supply voltage setup time, and reduce charge/discharge current of a load capacitance such as a redundant N-well capacitance, whereby a high-performance and low-power consumption nonvolatile semiconductor memory device can be realized. Also, by using an existing voltage boost circuit generating a maximum voltage, the need for an external high-voltage application terminal and an external applied-voltage control terminal is eliminated. Thus, it is possible to reduce the area of the circuit.

Note that the row decoder 2 may be provided with one very large N-well, in which a PMOS transistor is formed, to eliminate the need of dividing the N-well, whereby it is possible to reduce the area of the circuit.

FIG. 7 is a block diagram showing a structure of a nonvolatile semiconductor memory device in a third embodiment of the present invention. In FIG. 7, any component elements that have similar counterparts in the second embodiment as shown in FIG. 3 will be denoted by the same reference numerals as those used therein, and the detailed description thereof is omitted.

The third embodiment is characterized by including an N-well voltage changing switch 19 using two types of voltages: a high boost output voltage VPPH and a regulator output voltage VRO as an input, and selecting and outputting one of the two types of voltages in accordance with an N-well control signal. In a stop state (STOP) and a read operation (Read), the N-well voltage changing switch 19 selects the regulator output voltage VRO in accordance with an N-well control signal. In a program (Program)/program verify (PV) operation, the N-well voltage changing switch 19 selects the high boost output voltage VPPH.

Hereinafter, an operation of the above-described nonvolatile semiconductor memory device of the present embodiment will be described. As is the case with the second embodiment of the present invention, in a program/program verify operation, the high boost output voltage VPPH is supplied to the N-well potential input terminal in accordance with an N-well control signal. Therefore, the description of any such parts that are similar to the second embodiment will be omitted in the third embodiment. Hereinafter, only a read operation is described. In a read operation, 1V is applied to a selected bit line BL at the same time as the regulator output voltage VRO (=4.5V) is applied to a control gate of a cell to be read. Also, 0V is applied to the common source line SL. At this time, a bit line potential is detected and amplified by the sense amplifier 6, and a read data DB is outputted via the address/data buffer 5.

Figure 8:
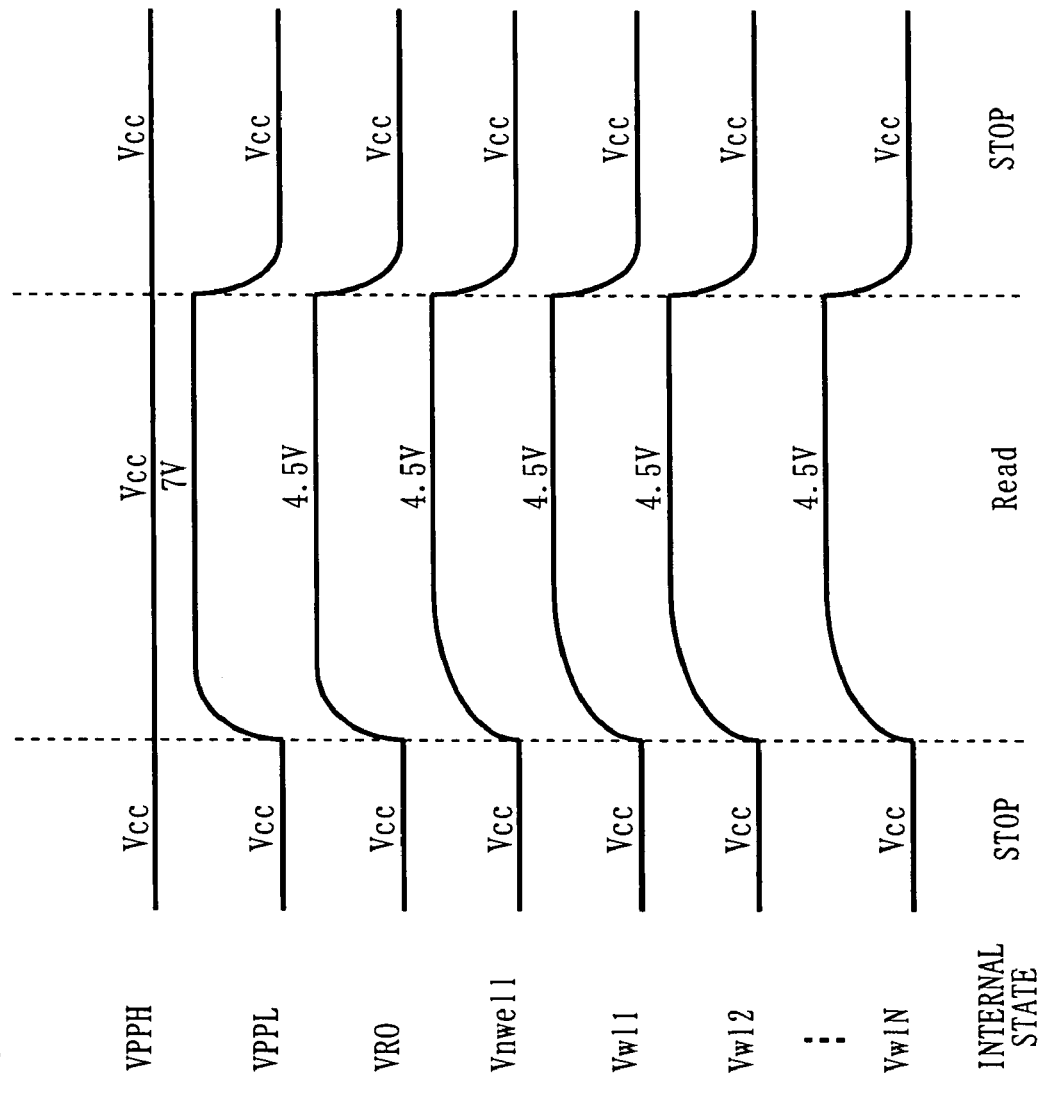
FIG. 8 is a timing chart showing a read operation in the third embodiment of the present invention.

FIG. 8 shows a timing chart indicating a voltage system supplied to a word line WL during a read operation. First, in a stop state (STOP), the high-voltage generation boost circuit 7, the low-voltage generation boost circuit 8, and the regulator circuit 9 enter a stopped state, and an N-well control signal and a switch control signal cause all unit switches of the N-well voltage changing switch 19 and the voltage changing switch circuit 17 to select the regulator output voltage VRO. Thus, the voltage Vnwell of the N-well node and the word line supply voltages Vwll to VwlN coincide with a power supply potential Vcc.

Figure 20:
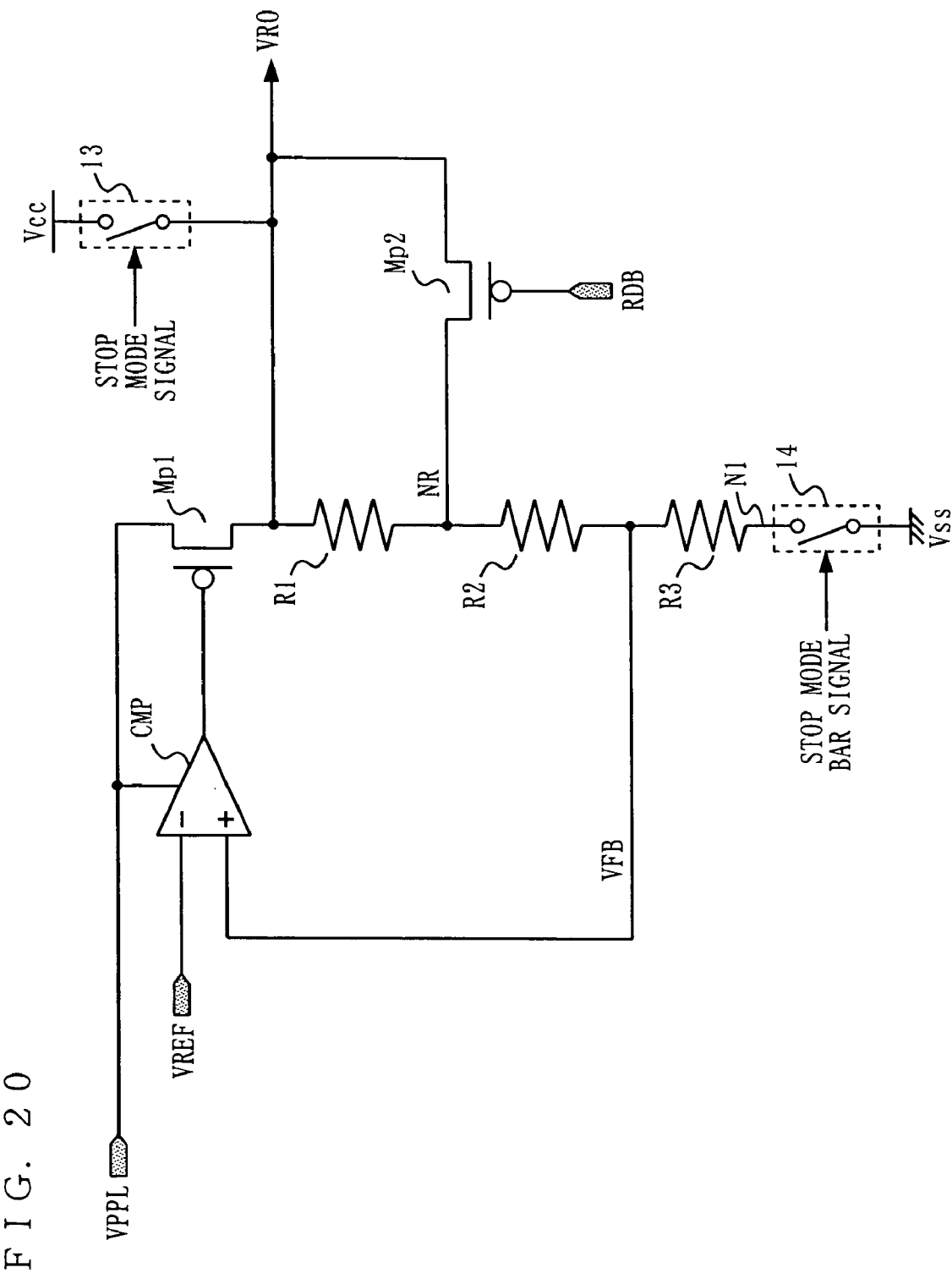
FIG. 20 is a circuit diagram showing a structure of a regulator circuit.
Figure 21:
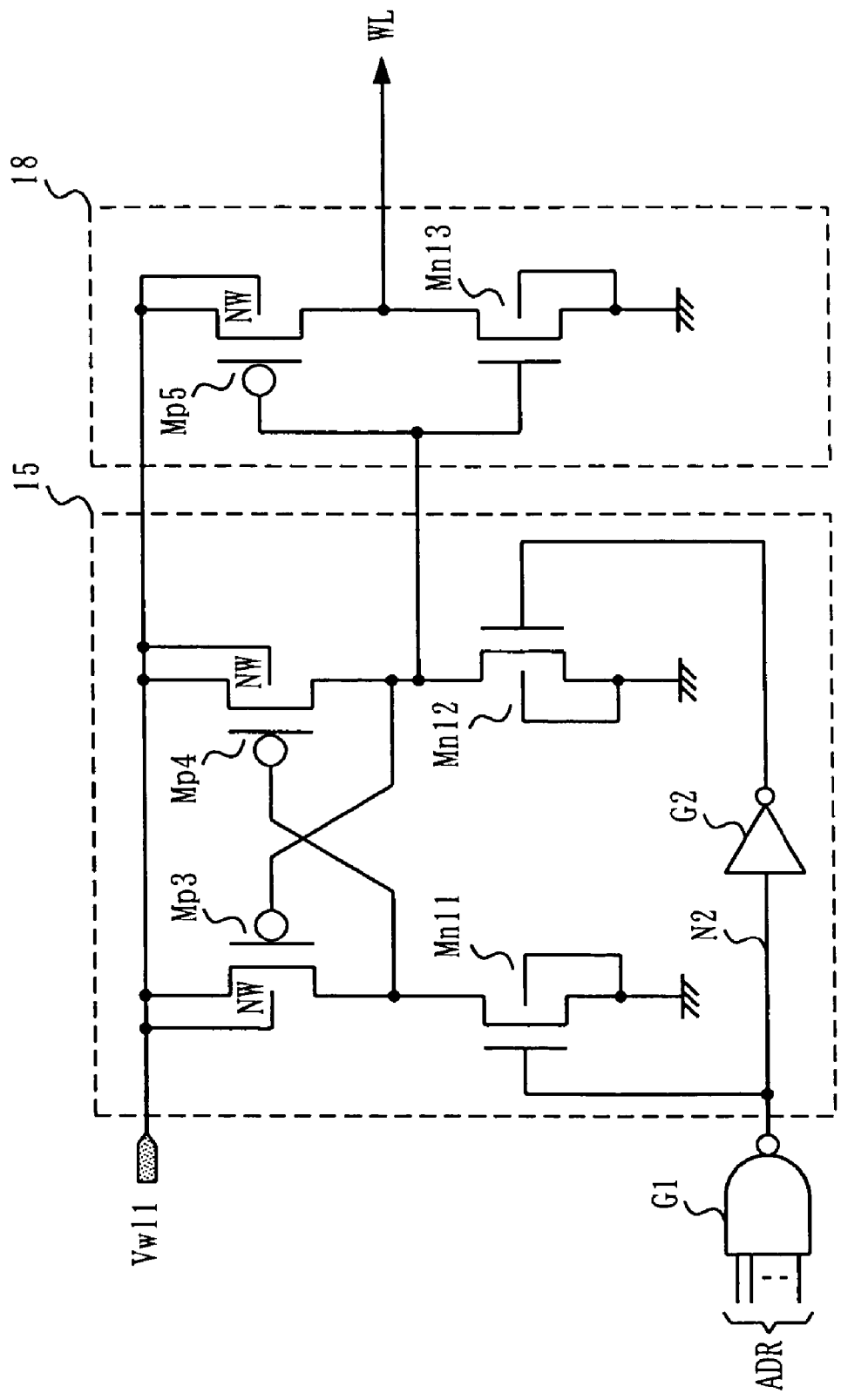
FIG. 21 is a circuit diagram showing a structure of a unit decoder used in the conventional nonvolatile semiconductor memory device and the first embodiment of the present invention.
Figure 22:
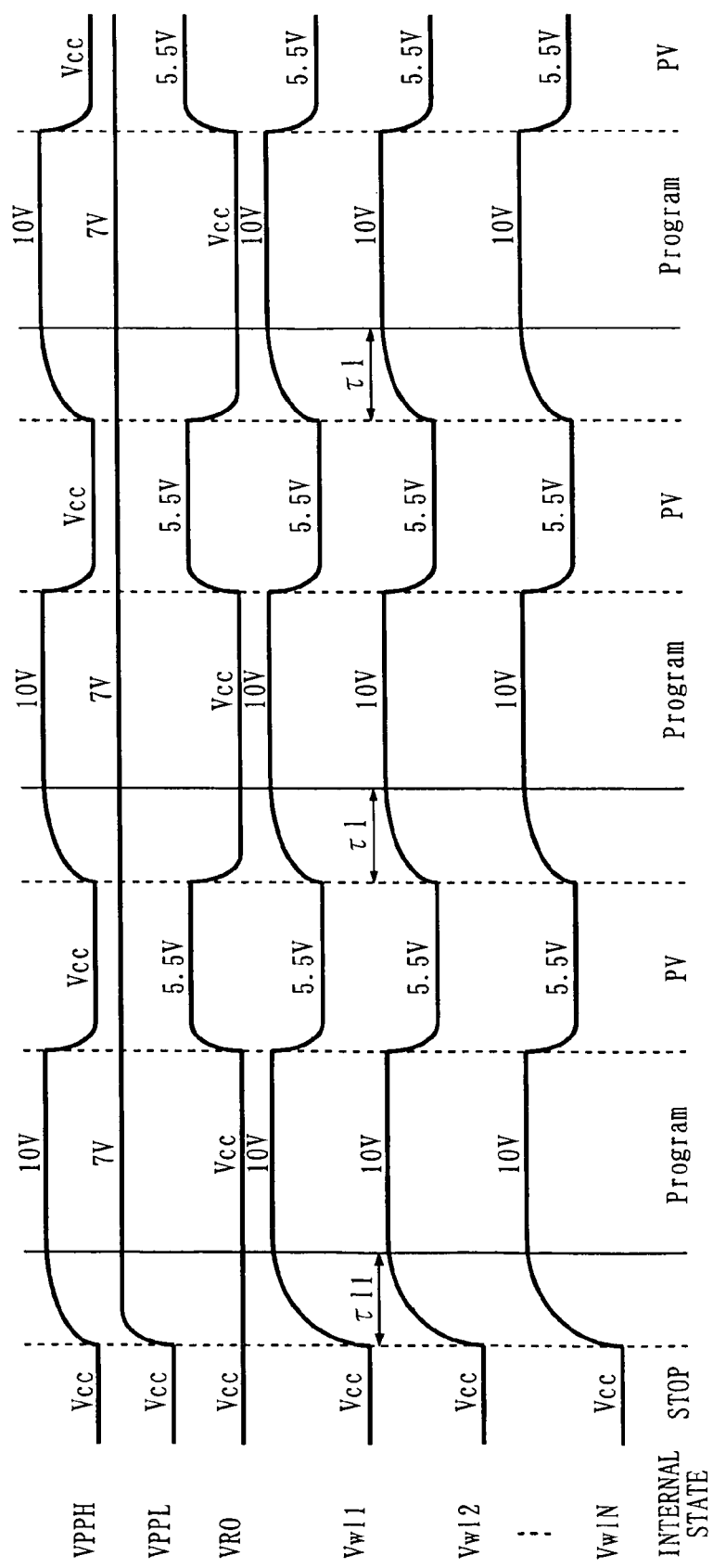
FIG. 22 is a timing chart showing a program operation and a program verify operation in the conventional nonvolatile semiconductor memory device.

When transition is made to a read state (Read), although the high-voltage generation boost circuit 7 continues to be in a stopped state, the low-voltage generation boost circuit 8 enters an operation state, and charges a load capacitance from the power supply potential Vcc up to a low boost output voltage VPPH (=7V) At this time, the regulator circuit 9 as shown in FIG. 20 also enters an operation state, a mode control signal RDB is deactivated, the PMOS transistor Mp2 switches to an ON state, and the resistance R1 is disabled. At the same time, a stop mode signal is deactivated and a stop mode bar signal is activated, whereby the switch circuits 13 and 14 are electrically disconnected and connected, respectively. As a result, the regulator output voltage VRO (=4.5V) is supplied to the N-well voltage changing switch 19 and the voltage changing switch circuit 17.

Next, an N-well control signal causes the N-well voltage changing switch 19 to select a regulator output voltage VRO, and a switch control signal causes the voltage changing switch circuit 17 to select a regulator output voltage VRO. Thus, the voltage Vnwell of the N-well node and the word line supply voltages Vwl1 to VwlN are charged up to a regulator output voltage VRO (=4.5V). As a result, a source potential of the PMOS transistors Mp3, Mp4, and Mp5 comprising the unit decoder as shown in FIG. 5 and an N-well potential are the same in potential, thereby preventing a threshold value from being increased due to the substrate bias effect.

As described above, according to the third embodiment, by including the N-well voltage changing switch 19 which selects one of the two types of voltages: a high boost output voltage VPPH and a regulator output voltage VRO in accordance with an N-well control signal, and supplies the selected voltage to the N-well potential input terminal, the following effects can be obtained. Firstly, as is the case with the second embodiment, it is possible to reduce a memory cell gate supply voltage setup time, and reduce charge/discharge current of a load capacitance such as a redundant N-well capacitance; and Secondly, it is possible to suppress increase in a threshold value due to the back bias effect of a PMOS transistor, which comprises a unit decoder, in a read operation with simple control using the existing regulator circuit 9. As a result, current drive capacity is improved, and high-speed readout is realized. Also, it is possible to stop a voltage boost circuit supplying a maximum voltage during a read operation, whereby power consumption at the time of readout can be considerably reduced.

Figure 9:
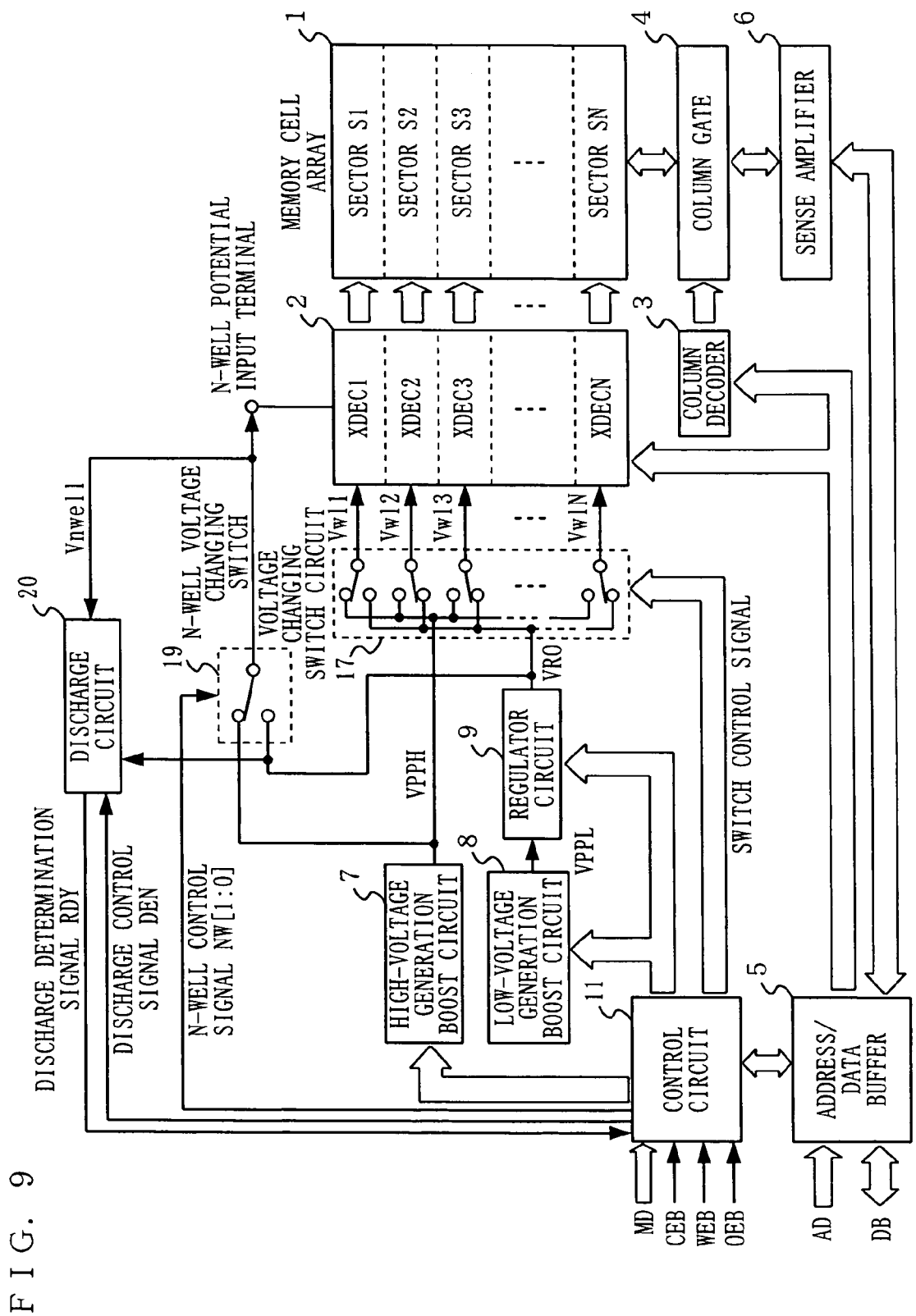
FIG. 9 is a block diagram showing a structure of a nonvolatile semiconductor memory device in the fourth embodiment of the present invention.

FIG. 9 is a block diagram showing a structure of a nonvolatile semiconductor memory device in a fourth embodiment of the present invention. In FIG. 9, any component elements that have similar counter parts in the third embodiment as shown in FIG. 7 will be denoted by the same reference numerals as those used therein, and the detailed description thereof is omitted.

The fourth embodiment is characterized by including a discharge circuit 20. The discharge circuit 20 compares the regulator output voltage VRO with the voltage Vnwell of the N-well node in accordance with a discharge control signal DEN. When the voltage Vnwell of the N-well node is discharged from the high boost output voltage VPPH to the regulator output voltage VRO, the discharge circuit 20 stops the discharge operation, and outputs a discharge determination signal RDY to the control circuit 11.

As shown in FIG. 9, in accordance with an N-well control signal NW[1:0] outputted from the control circuit 11, the N-well voltage changing switch 19 switches between the following three states: a high boost output voltage VPPH selection state, a regulator output voltage VRO selection state, and a non-selection state (HiZ) in which neither of the above two voltages is selected. Specifically, when an N-well control signal NW[1:0] is 0 h, the N-well voltage changing switch 19 selects a high boost output voltage VPPH. When an N-well control signal NW[1:0] is 1 h, the N-well voltage changing switch 19 enters the non-selection state (HiZ) .

When an N-well control signal NW[1:0] is 2 h, the N-well voltage changing switch 19 selects a regulator output voltage VRO.

Figure 10:
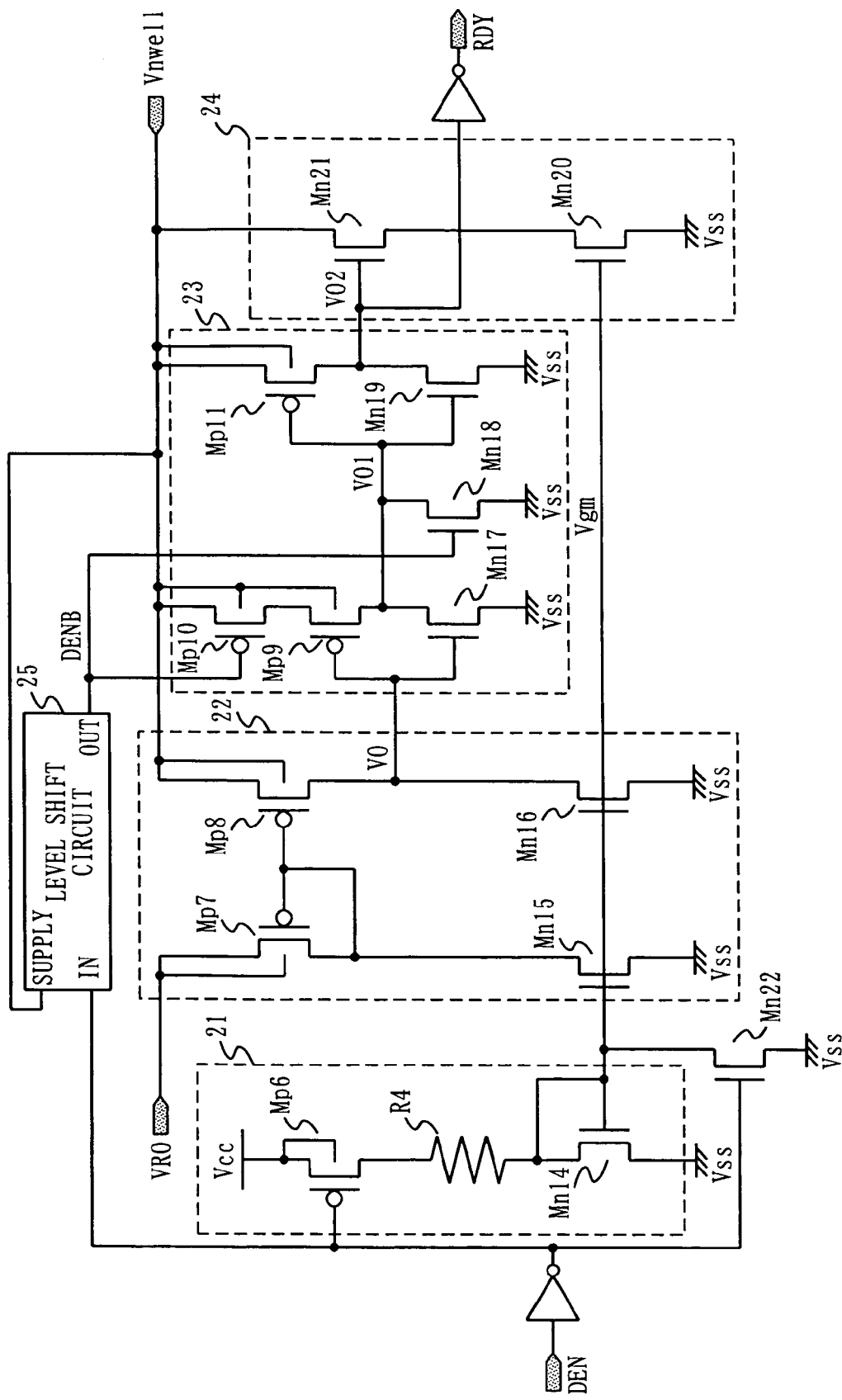
FIG. 10 is a circuit diagram showing an exemplary discharge circuit in the fourth embodiment of the present invention.

Also, a specific structure of the discharge circuit 20 is shown in FIG. 10. As shown in FIG. 10, the essential parts of the discharge circuit 20 include a current mirror section 21, a voltage detection/comparison section 22, a detection result amplification section 23, and a discharge section 24. The current mirror section 21 includes an NMOS transistor Mn14, a PMOS transistor Mp6, and a resistance R4. The source terminal of the NMOS transistor Mn14 whose gate terminal and drain terminal are connected to each other is fixed to a ground potential Vss. The gate terminal of the NMOS transistor Mn14 outputs a mirror gate potential Vgm. The drain terminal of the NMOS transistor Mn14 is connected to one end of the resistance R4. The other end of the resistance R4 is connected to the drain terminal of the PMOS transistor Mp6. The source terminal and the substrate terminal of the PMOS transistor Mp6 are fixed to a power supply potential Vcc, and an inversion signal of a discharge control signal DEN is inputted to the gate terminal of the PMOS transistor Mp6.

As such, when a discharge control signal DEN is activated, the current mirror section 21, in which the PMOS transistor Mp6 is electrically connected, functions as a current mirror circuit passing through a current of 10 uA, and outputs a gate potential Vgm to the voltage detection/comparison section 22 and the discharge section 24. When a discharge control signal DEN is deactivated, the PMOS transistor Mp6 is electrically disconnected to interrupt a DC current. The voltage detection/comparison section 22 includes NMOS transistors Mn15 and Mn16 whose ratios are each equal to that of the NMOS transistor Mn14, and PMOS transistors Mp7 and Mp8. The mirror gate potential Vgm is inputted to the gate terminals of the NMOS transistors Mn15 and Mn16. Each of the source terminals of the NMOS transistors Mn15 and Mn16 is fixed to the ground potential Vss. The drain terminal of the NMOS transistor Mn15 is connected to the drain terminal of the PMOS transistor Mp7 whose gate terminal and drain terminal are connected to each other. The regulator output voltage VRO is inputted to the source terminal and the substrate terminal of the PMOS transistor Mp7. The gate terminal of the PMOS transistor Mp7 is connected to the gate terminal of the PMOS transistor Mp8. The voltage Vnwell of the N-well node is inputted to the source terminal and the substrate terminal of the PMOS transistor Mp8. The drain terminal of the PMOS transistor Mp8 outputs a detection voltage VO, and is connected to the drain terminal of the NMOS transistor Mn16.

As such, when the discharge control signal DEN is activated, the voltage detection/comparison section 22 compares the voltage Vnwell of the N-well node with the regulator output voltage VRO. In the case where the voltage Vnwell of the N-well node is higher than the regulator output voltage VRO, the voltage detection/comparison section 22 outputs a high level voltage as a detection voltage VO. In the case where the voltage Vnwell of the N-well node is lower than the regulator output voltage VRO, the voltage detection/comparison section 22 outputs a low level voltage. At this time, a current of 10 uA passes through the current-mirror NMOS transistors Mn15 and Mn16.

The detection result amplification section 23 includes a two input NOR circuit composing NMOS transistors Mn17 and Mn18 and PMOS transistors Mp9 and Mp10, and an inverter composing an NMOS transistor Mn 19 and a PMOS transistor Mp11. The voltage Vnwell of the N-well node is inputted to the NOR circuit as a power supply. The detection voltage VO and a discharge control bar signal DENB are inputted to the NOR circuit, and the NOR circuit outputs a NOR output voltage VO1. The discharge control bar signal DENB is obtained by inputting an inversion signal of the discharge signal DEN to the level shift circuit 25 to level-shift the inversion signal from an amplitude of the power supply voltage to an amplitude of the voltage Vnwell of the N-well node. The inverter circuit uses the voltage Vnwell of the N-well node as a power supply, and outputs a detection result amplification output voltage VO2, which is obtained by inverting the NOR output voltage VO1.

As such, when the discharge control signal DEN is activated, the discharge control bar signal DENB becomes a low level, the PMOS transistor Mp10 is electrically connected, and the NMOS transistor Mn18 is electrically disconnected. Thus, the detection result amplification section 23 operates as a two-phase amplification circuit of the inverter, and amplifies the detection voltage VO to output the detection result amplification output voltage VO2.

On the other hand, when the discharge control signal DEN is deactivated, the discharge control bar signal DENB becomes a high level. As a result, a DC current is interrupted since the PMOS transistor Mp10 is electrically disconnected and the NMOS transistor Mn18 is electrically connected. The discharge section 24 includes NMOS transistors Mn20 and Mn21 which are connected to each other in series. The mirror gate potential Vgm is inputted to the gate terminal of the NMOS transistor Mn20, whereas the ground potential Vss is inputted to the source terminal of the NMOS transistor Mn20. The detection result amplification output voltage VO2 is inputted to the gate terminal of the NMOS transistor Mn21, whereas the voltage Vnwell of the N-well node is inputted to the drain terminal of the NMOS transistor Mn21.

As such, in the discharge section 24, in the case where the detection result amplification output voltage VO2 is at a high level when the discharge control signal DEN is activated, the NMOS transistors Mn20 and Mn21 are electrically connected. In this case, assume that the NMOS transistor Mn20 has 50 times the ratio of the NMOS transistor Mn14, the voltage Vnwell of the N-well node is discharged by a current mirror DC current of 500 uA. In the case where the detection result amplification output voltage VO2 is at a low level, the NMOS transistor Mn21 is electrically disconnected. Thus, the discharge of the voltage Vnwell of the N-well node is stopped. The NMOS transistor Mn22 is provided to interrupt a DC current to the current mirror section 21, the voltage detection/comparison section 22, and the discharge section 24 when the discharge is stopped, i.e., when the discharge control signal DEN is deactivated. An inversion signal of the discharge control signal DEN is inputted to the gate terminal of the NMOS transistor Mn22. The source terminal of the NMOS transistor Mn22 is fixed to the ground potential Vss, and the drain terminal thereof is connected to the gate terminals of the NMOS transistors Mn14 to Mn16, and Mn20.

As described above, when the discharge control signal DEN is activated, the NMOS transistor Mn22 is electrically disconnected. When the discharge control signal DEN is deactivated, the NMOS transistor Mn22 is electrically connected, and the mirror gate potential Vgm is fixed to the ground potential Vss to interrupt DC current to the current mirror section 21, the voltage detection/comparison section 22, and the discharge section 24. Also, the discharge circuit 20 outputs the discharge determination signal RDY obtained by inverting and amplifying the detection result amplification output voltage VO2.

Figure 11:
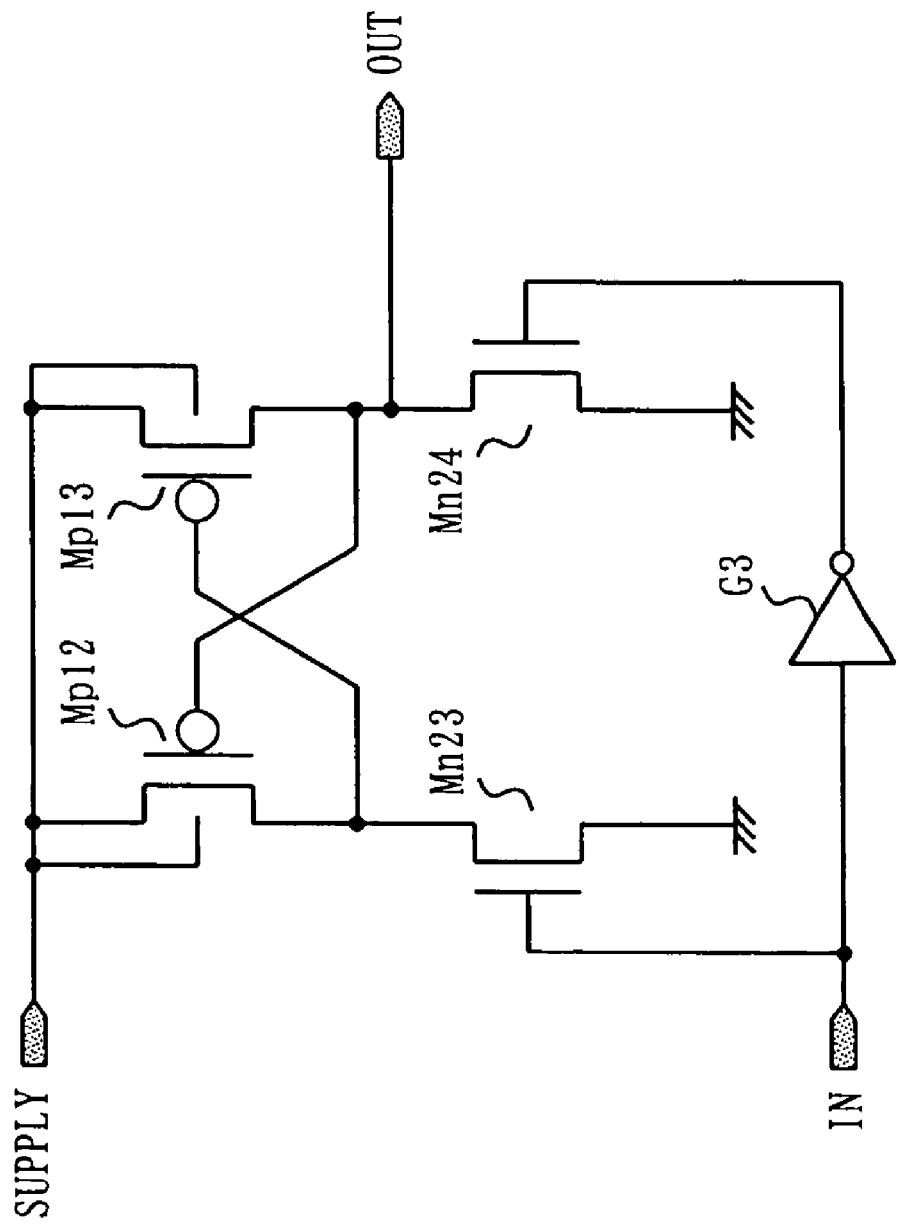
FIG. 11 is an illustration showing a circuit configuration of a level shift circuit in the fourth embodiment of the present invention.

FIG. 11 is a specific circuit diagram of the level shift circuit 25 as shown in FIG. 10. The level shift circuit 25 includes NMOS transistors Mn23 and Mn24, PMOS transistors Mp12 and Mp13, and an inverter gate G3. When a high level voltage is inputted to an input terminal IN, a voltage level inputted to a voltage supply terminal SUPPLY is outputted to an output terminal OUT. When a low level voltage is inputted to the input terminal IN, a ground potential Vss level is outputted to the output terminal OUT. As such, when the discharge control signal DEN is deactivated, the discharge circuit 20 enters a stopped state, and the discharge determination signal RDY becomes a low level. In the case where the discharge control signal DEN is activated and the voltage Vnwell of the N-well node is higher than the regulator output voltage VRO, the voltage Vnwell of the N-well node is discharged by a current of approximately 510 uA. When the voltage Vnwell of the N-well node is lower than the regulator output voltage VRO, the discharge operation is stopped, and the discharge determination signal RDY becomes a high level.

Figure 12:
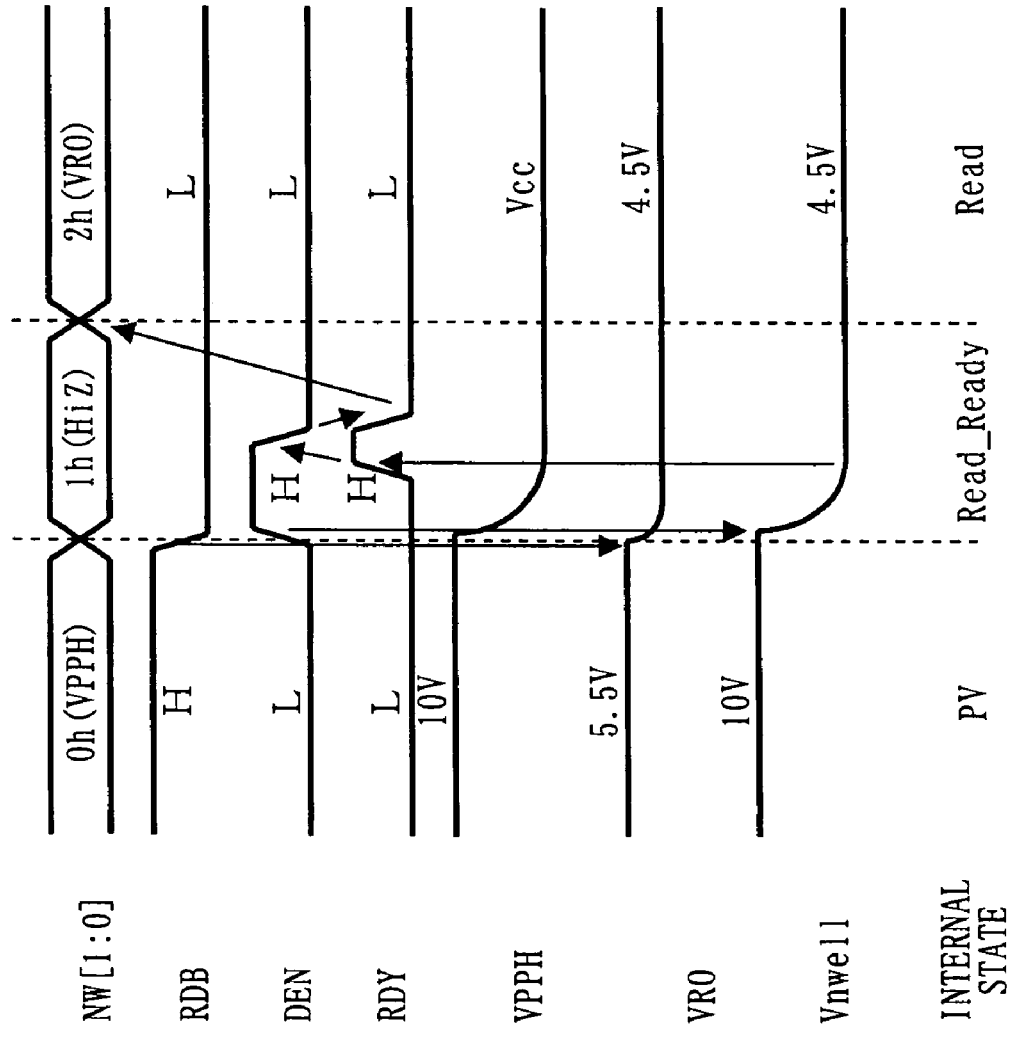
FIG. 12 is a timing chart showing a program verify operation and a read operation in the fourth embodiment of the present invention.

Hereinafter, an operation of the above-described nonvolatile semiconductor memory device of the present embodiment will be described. FIG. 12 shows a timing chart for describing a discharge operation of the voltage Vnwell of the N-well node when a transition is made from a program verify operation (PV) to a read operation (Read). First, in a program verify state (PV), the high-voltage generation boost circuit 7, the low-voltage generation boost circuit 8, and the regulator circuit 9 enter an operation state, and the control circuit 11 outputs 0 h as the N-well control signal NW[1:0]. Thus, the N-well voltage changing switch 19 selects the high boost output voltage VPPH (=10V), and the voltage Vnwell of the N-well node becomes 10V. At this time, the mode control signal RDB becomes a high level, and the regulator circuit 9 outputs VRO=5.5V. On the other hand, the discharge control signal DEN remains a low level. Thus, a discharge operation of the voltage Vnwell of the N-well node is not performed, and the discharge determination signal RDY remains low level. As a result, the program verify operation (PV) is identical to that of the third embodiment of the present invention, and the detailed description thereof is omitted.

Next, when a transition is made from a program verify state (PV) to a read ready state (Read_Ready) after program verify is completed, the high-voltage generation boost circuit 7 first enters a stopped state, the high boost output voltage VPPH (10V) is discharged to the power supply potential Vcc, and the control circuit 11 outputs 1 h as the N-well control signal NW[1:0]. Thus, the N-well voltage changing switch 19 enters a non-selection state (HiZ). At this time, the mode control signal RDB becomes a low level, and the regulator circuit 9 outputs VRO=4.5V.

On the other hand, the discharge control signal DEN becomes a high level, and the voltage Vnwell of the N-well node is discharged to the regulator output voltage VRO (=4.5V) since the voltage Vnwell (=10V) of the N-well node is higher than the regulator output voltage VRO (=5.5V). After the discharge is completed, the discharge determination signal RDY becomes a high level. On receiving the above discharge determination signal RDY, the control circuit 11 reduces the discharge control signal DEN to a low level. As a result, the discharge circuit 20 enters a stopped state, and the discharge determination signal RDY becomes a low level. By using a falling edge of the discharge determination signal RDY as a trigger, the control circuit 11 outputs 2 h as the N-well control signal NW[1:0], and the N-well voltage changing switch 19 selects the regulator output voltage VRO (=4.5V). Thus, a steady voltage (4.5V) is supplied as the voltage Vnwell of the N-well node, and a transition is made from a read ready state (Read_Ready) to a read operation (Read). Here, the read operation (Read) of the present embodiment is identical to that of the third embodiment of the present invention, and the detailed description thereof is omitted.

As described above, according to the fourth embodiment, the same effect as that of the third embodiment can be realized. In addition, by including the discharge circuit 20 for comparing the regulator output voltage VRO with the voltage Vnwell of the N-well node in accordance with the discharge control signal DEN, and discharging the voltage Vnwell of the N-well node from the high boost output voltage VPPH to the regulator output voltage VRO, a reduction speed of a high boost charge is enhanced. As a result, it is possible to reduce a read setup time.

Figure 13:
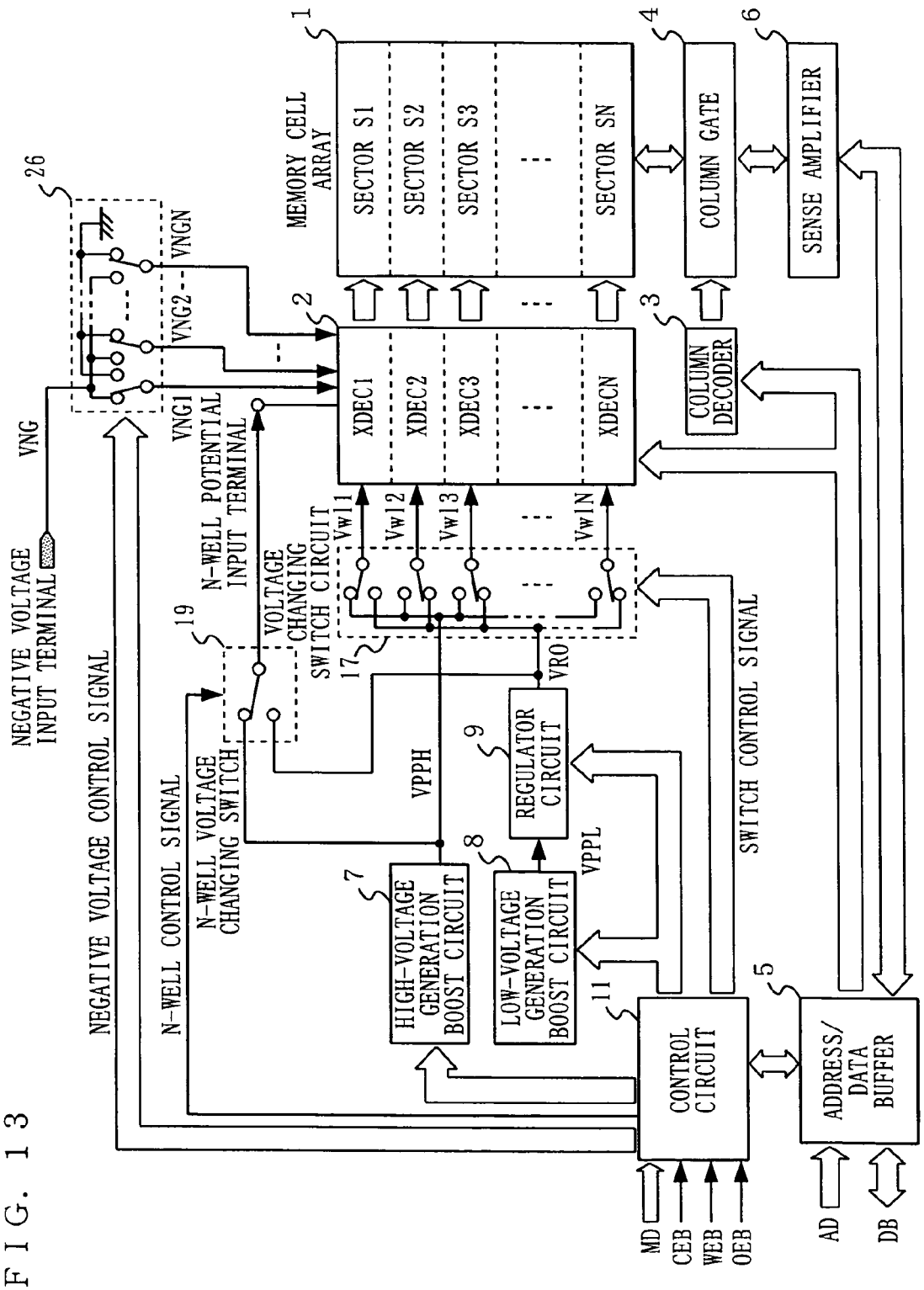
FIG. 13 is a block diagram showing a structure of a nonvolatile semiconductor memory device in a fifth embodiment of the present invention.

FIG. 13 is a block diagram showing a structure of a nonvolatile semiconductor memory device in a fifth embodiment of the present invention. In FIG. 13, any component elements that have similar counterparts in FIG. 7 will be denoted by the same reference numerals as those used therein, and the detailed description thereof is omitted.

The fifth embodiment is characterized in that each of the decoder blocks XDEC1 to XDECN comprising the row decoder 2 includes a plurality of PMOS transistors included in an N-well and a plurality of NMOS transistors included in a P-well provided in the N-well. That is, the fifth embodiment is characterized in that the row decoder 2 having a triple-well structure is adopted.

As shown in FIG. 13, a negative voltage changing switch circuit 26 is provided. The negative voltage changing switch circuit 26 comprises N (N is natural number) unit switches using two types of voltages: a negative voltage VNG (=−8V) inputted from a negative voltage generation boost circuit (not shown) or a negative voltage external application terminal (not shown), for example, into a negative voltage input terminal, and a ground potential Vss as an input, and selecting and outputting one of the two types of voltages in accordance with a negative voltage control signal. In an erase operation, in accordance with a negative voltage control signal, the negative voltage changing switch circuit 26 causes only one desired unit switch to select the negative voltage VNG, and the other unit switches to select the ground potential Vss. In other operation states, in accordance with the negative voltage control signal, all unit switches select the ground potential Vss. At this time, non-selected word line voltages VNG1 to VNGN, which are output voltages of the negative voltage changing switch circuit 26, are supplied to the decoder blocks XDEC1 to XDECN, respectively.

Figure 14:
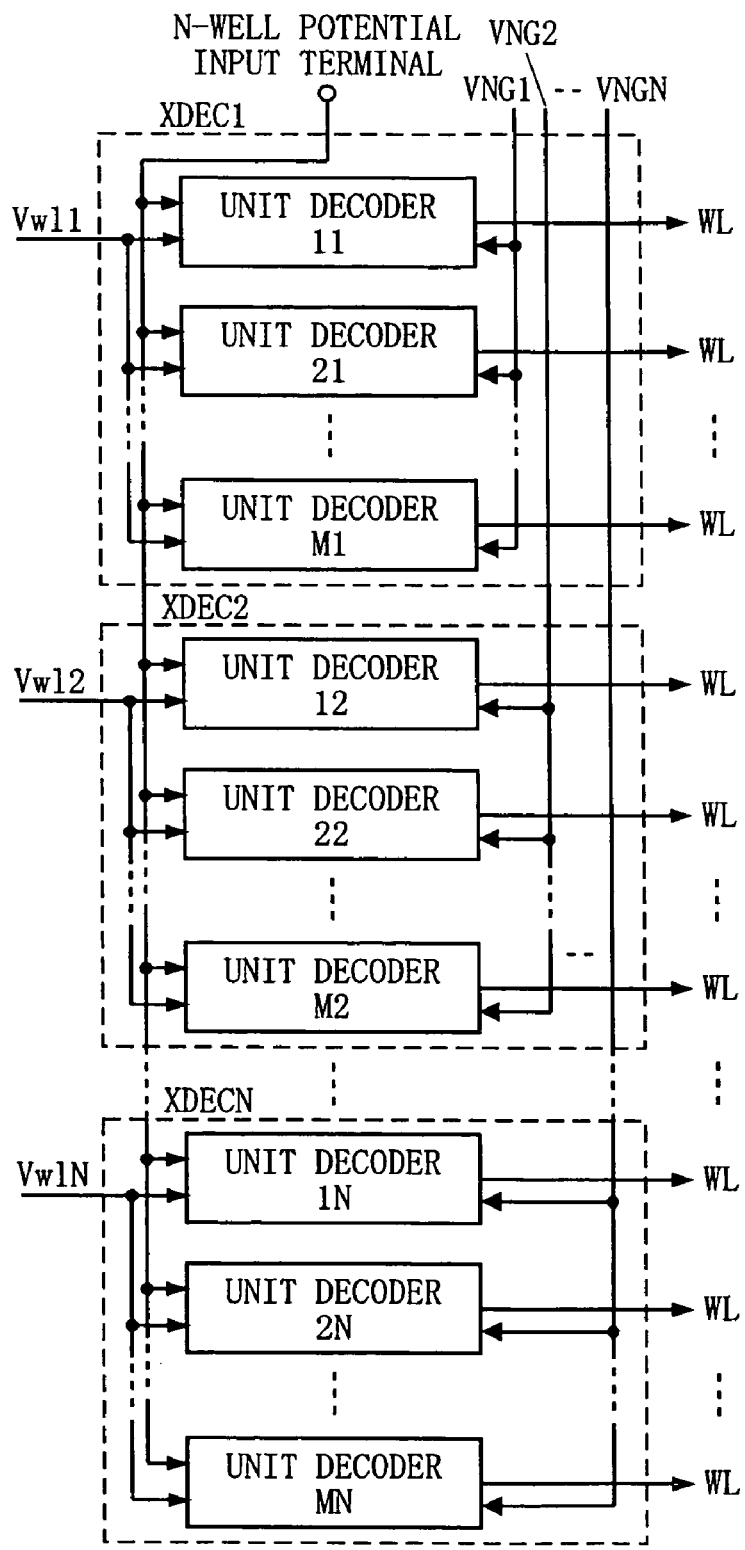
FIG. 14 is a block diagram showing an exemplary structure of a row decoder in the fifth embodiment of the present invention.
Figure 15:
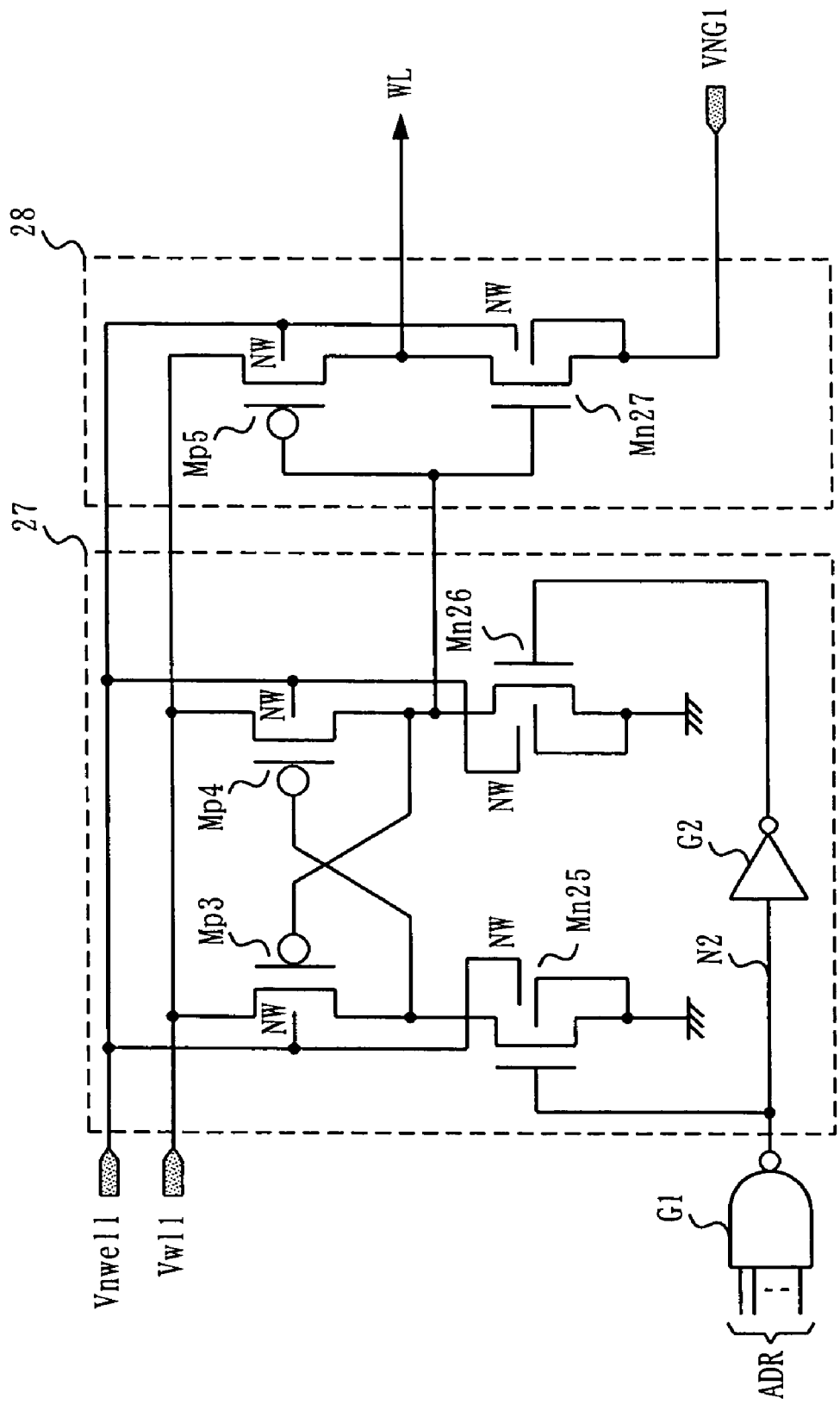
FIG. 15 is a circuit diagram showing a structure of a unit decoder in the fifth embodiment of the present invention.

The row decoder 2 comprises unit decoders U1X to UMX (X=1, 2, . . . , N) as shown in FIG. 14, and the non-selected word line voltages VNGX (X=1, 2, . . . , N) are inputted to the unit decoders U1X to UMX (X=1, 2, . . . , N), respectively. As shown in FIG. 15, each of the unit decoders U1X to UMX (X=1, 2, . . . , N) has a triple-well structure, and comprises NMOS transistors Mn25 to Mn27 and PMOS transistors Mp3 to Mp5, which share a common N-well, and an inverter gate G2. The level shift circuit 27 is obtained by re-structuring the level shift circuit 117 as shown in FIG. 5 so as to have a triple-well structure. The driver circuit 28 is obtained by re-structuring the driver circuit 18 as shown in FIG. 5 so as to have a triple-well structure, and changing the ground potential Vss to a non-selected word line voltage VNG1.

Therefore, in an erase operation by which a negative voltage is applied to the word line WL, in accordance with a negative voltage control signal, the negative voltage changing switch circuit 26 supplies the negative voltage VNG (=−8V) only to a desired non-selected word line voltage VNG1, and supplies the ground potential Vss to the other non-selected word line voltages VNG2 to VNGN. Thus, all unit decoders U1X to UMX (X=1, 2, . . . , N) are caused to enter a non-selection state, and the non-selected word line voltages VNG1 (=−8V) and VNG2 to VNGN (=0V) are applied to the control gates of the memory cells MC connected to the word lines WL of the sectors SX (X=1 to N) corresponding to the non-selected word line voltages VNG1 to VNGN.

Hereinafter, an operation of the above-described nonvolatile semiconductor memory device of the present embodiment will be described. In a data erase operation, a non-selected word line voltage VNG1 (=−8V) is applied, as a word line WL voltage, to the control gate of the memory cell MC of the sector S1 in accordance with an input of an address AD of the sector S1, and 0V is applied to the word lines WL of the other sectors S2 to SN. At this time, 5V is applied to all bit lines BL, and the common source line SL becomes high impedance. As a result, erasure is performed for all memory cells MC of the sector S1 which is connected to the word line WL to which the negative voltage is applied, and is provided with the drain terminal to which 5V is applied via the bit line BL, the amount of electron of the floating gate is reduced, and a threshold value of the memory cell MC decreases in a negative direction.

Specific operations of the power supply circuit and the decoder 2 are as follows: the high-voltage generation boost circuit 7, the low-voltage generation boost circuit 8, and the regulator circuit 9, which are shown in FIG. 13, enter a stopped state, and the high boost output voltage VPPH and the regulator output voltage VRO coincide with the power supply potential Vcc and are supplied to the voltage changing switch circuit 17 and the N-well voltage changing switch 19. Next, in the voltage changing switch circuit 17, the regulator output voltage VRO (=Vcc) is selected in accordance with a switch control signal supplied from the control circuit 11, and is supplied to all decoder blocks XDEC1 to XDECN of the row decoder 2 as the word line supply voltages Vwl1 to VwlN. At the same time, in the N-well voltage changing switch 19, the regulator output voltage VRO (=Vcc) is selected in accordance with an N-well control signal supplied from the control circuit 11, and the regulator output voltage VRO (=Vcc) is applied to the N-well potential input terminal of the row decoder 2. At this time, in accordance with a negative voltage control signal, the negative voltage changing switch circuit 26 supplies the negative voltage VNG (=−8V) to only a desired non-selected word line voltage VNG1, and supplies the ground potential Vss to the other non-selected word line voltages VNG2 to VNGN. Thus, all unit decoders U1X to UMX (X=1, 2, . . . , N) are caused to enter a non-selection state, and the non-selected word line voltage VNG1 (=−8V) is applied to the control gates of the memory cells MC connected to the word lines WL of the sector S11, whereas the non-selected word line voltages VNG2 to VNGN (=0V) are applied to the control gates of the memory cells MC connected to the word lines WL of the sectors S2 to SN corresponding to the non-selected word line voltages VNG2 to VNGN. As a result, erasure is performed for all memory cells MC of the sector S1.

As described above, according to the fifth embodiment, the same effect as that of the third embodiment can be realized. In addition, by structuring each of the decoder blocks XDEC1 to XDECN comprising the row decoder 2 with a plurality of PMOS transistors included in an N-well and a plurality of NMOS transistors included in a P-well provided in the N-well (triple-well structure), it is possible to apply a negative voltage to the word line WL when erasure is performed. As a result, it is possible to improve the reliability such as disturb characteristics and endurance characteristics of the memory cell MC, compared to the case in which erasure is performed by using only a positive voltage.

Note that, in the present embodiment, it is assumed that the number of sectors S1 to SN (N sectors) comprising a memory array 1 coincides with the number of non-selected word line voltages VNG1 to VNGN (N non-selected word line voltages). However, it is not limited thereto.

As described above, the nonvolatile semiconductor memory device according to the present invention has an effect of reducing a time required for a program/program verify operation while reducing power consumption. The non volatile semiconductor memory device according to the present invention is useful as a nonvolatile semiconductor memory device having a memory cell array in which a plurality of memory cells are disposed in the form of a matrix and are divided into a plurality of sectors, for example.

While the invention has been described in detail, the foregoing description is in all aspects illustrative and not restrictive. It is understood that numerous other modifications and variations can be devised without departing from the scope of the invention.

What is claimed is:

1. A nonvolatile semiconductor memory device comprising:
   a memory cell array in which a plurality of memory cells are disposed in a form of a matrix and are divided into a plurality of sectors;
   a plurality of row decoder circuits, each of which is provided so as to correspond to each sector of the memory cell array for selecting a memory cell included in the corresponding sector based on an externally inputted address signal;
   a plurality of switches provided so as to correspond to the plurality of row decoder circuits, such that each switch is operable to separately select and output any of a plurality of types of voltages supplied thereto to the corresponding row decoder circuit;
   a voltage boost circuit for generating the plurality of types of voltages by boosting a power supply voltage; and
   a regulator circuit for stepping down at least one of the plurality of types of voltages generated by the voltage boost circuit to stabilize a voltage value, and outputting the resultant voltage to each switch, wherein
   the row decoder circuit selects the memory cell by using a voltage outputted from the corresponding switch.

2. The nonvolatile semiconductor memory device according to claim 1, further comprising:
   a control circuit for generating a switch control signal used for selecting each switch based on the address signal, wherein
   each switch selects a voltage to be outputted to the corresponding row decoder circuit based on the switch control signal.

3. The nonvolatile semiconductor memory device according to claim 2, wherein
   the plurality of types of voltages at least include a first voltage and a second voltage which is lower than the first voltage, and
   when data is written to a memory cell, the control circuit generates a switch control signal based on the address signal for causing one of the row decoder circuits, which is used for selecting the memory cell, to output the first voltage, and causing the other row decoder circuits to output the second voltage.

4. The nonvolatile semiconductor memory device according to claim 1, wherein
   each row decoder circuit includes a plurality of PMOS transistors formed in an N-well, and
   the nonvolatile semiconductor memory device further comprising:
   an N-well input terminal for applying any of the plurality of types of voltages generated by the voltage boost circuit to the N-well; and
   a boost control circuit for controlling the voltage boost circuit so that a voltage is applied to the N-well input terminal before data is written to a memory cell.

5. The nonvolatile semiconductor memory device according to claim 4, wherein a third voltage, which is a highest voltage of the plurality of types of voltages, is applied to the N-well input terminal before data is written.

6. The nonvolatile semiconductor memory device according to claim 5, further comprising
   an N-well voltage changing switch for selecting a voltage to be outputted to the N-well input terminal; and
   a switch control circuit for switching between the third voltage and a fourth voltage which is lower than the third voltage, and causing the N-well voltage changing switch to output either the third or fourth voltage.

7. The nonvolatile semiconductor memory device according to claim 6, wherein
   before data is written, the switch control circuit controls the N-well voltage changing switch so as to apply the third voltage to the N-well input terminal, and
   when data is read, the switch control circuit controls the N-well voltage changing switch so as to apply the fourth voltage to the N-well input terminal.

8. The nonvolatile semiconductor memory device according to claim 7, further comprising:
   a voltage drop circuit for dropping a voltage of the N-well input terminal when the switch control circuit controls the N-well voltage changing switch so as to apply the fourth voltage; and
   a comparison circuit for comparing the voltage of the N-well input terminal dropped by the voltage drop circuit with the fourth voltage, wherein
   when the comparison circuit determines that the voltage of the N-well input terminal dropped by the voltage drop circuit and the fourth voltage have become equal, the switch control circuit controls the N-well voltage changing switch so as to apply the fourth voltage to the N-well input terminal.

9. The nonvolatile semiconductor memory device according to claim 1, wherein the row decoder includes:
   a plurality of PMOS transistors formed in an N-well; and
   a plurality of NMOS transistors formed in a P-well formed in the N-well.

10. The nonvolatile semiconductor memory device according to claim 9, further comprising:
a negative voltage input terminal for applying either at least one negative voltage included in the plurality of voltages generated by the voltage boost circuit or a ground voltage to a control gate of the memory cell via the row decoder circuit; and
a boost control circuit for controlling the voltage boost circuit so as to apply a negative voltage to the negative voltage input terminal when an amount of electron is reduced in a charge storage area provided on the memory cell.

11. The nonvolatile semiconductor memory device according to claim 1, wherein
the at least one type of voltage is a voltage to be used when data is read.

* * * * *